(12) United States Patent
Nakajima

(10) Patent No.: US 10,833,023 B2
(45) Date of Patent: Nov. 10, 2020

(54) CIRCUIT MODULE

(71) Applicant: Murata Manufacturing Co., Ltd., Kyoto (JP)

(72) Inventor: Reiji Nakajima, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 16/581,911

(22) Filed: Sep. 25, 2019

(65) Prior Publication Data

US 2020/0020645 A1 Jan. 16, 2020

Related U.S. Application Data

(63) Continuation of application No. PCT/JP2018/011572, filed on Mar. 23, 2018.

(30) Foreign Application Priority Data

Mar. 30, 2017 (JP) ................. 2017-067489

(51) Int. Cl.
  *H03F 3/187* (2006.01)
  *H01L 23/552* (2006.01)
  (Continued)

(52) U.S. Cl.
  CPC ........ *H01L 23/552* (2013.01); *H01L 23/3121* (2013.01); *H01L 23/5384* (2013.01);
  (Continued)

(58) Field of Classification Search
  CPC ...................................... H03F 3/187
  (Continued)

(56) References Cited

U.S. PATENT DOCUMENTS 7,258,549 B2 * 8/2007 Asahi ................. H01R 13/2414
  174/255
8,248,892 B2 * 8/2012 Shimazawa ............ G11B 5/105
  360/59
(Continued)

FOREIGN PATENT DOCUMENTS

JP 2013-059220 A 3/2013
WO 2012/101920 A1 8/2012

OTHER PUBLICATIONS

International Search Report for International Application No. PCT/JP2018/011572, dated May 22, 2018.
(Continued)

*Primary Examiner* — Henry Choe
(74) *Attorney, Agent, or Firm* — Pearne & Gordon LLP

(57) ABSTRACT

A circuit module (100) includes an electronic component (30), a plurality of conductor posts (40), a mold layer (50) that seals a plurality of the electronic components (30) and the plurality of conductor posts (40), and a shield layer (60) on the mold layer (50). The electronic components (30) include a first electronic component (31) and second electronic components (32, 36). The plurality of conductor posts (40) includes a group of conductor posts (400) traversing between the first electronic component (31) and the second electronic components (32, 36). The shield layer (60) includes a slit (600) that, with respect to each conductor post (40) included in the group (400) of conductor posts, in a plan view, passes and extends between the conductor post (40) and the first electronic component (31), or between the conductor post (40) and the second electronic components (32, 36).

20 Claims, 11 Drawing Sheets

(51) Int. Cl.

| | |
|---|---|
| *H01L 23/31* | (2006.01) |
| *H01L 23/538* | (2006.01) |
| *H01L 23/66* | (2006.01) |
| *H01L 25/18* | (2006.01) |
| *H03F 1/26* | (2006.01) |
| *H03F 3/21* | (2006.01) |
| *H03F 3/68* | (2006.01) |
| *H04B 1/00* | (2006.01) |
| *H04B 1/04* | (2006.01) |

(52) U.S. Cl.
CPC .......... *H01L 23/5386* (2013.01); *H01L 23/66* (2013.01); *H01L 25/18* (2013.01); *H03F 1/26* (2013.01); *H03F 3/21* (2013.01); *H03F 3/68* (2013.01); *H04B 1/0057* (2013.01); *H04B 1/04* (2013.01); *H01L 2223/6616* (2013.01); *H01L 2223/6644* (2013.01); *H01L 2223/6677* (2013.01); *H03F 2200/114* (2013.01); *H03F 2200/294* (2013.01); *H03F 2200/312* (2013.01); *H03F 2200/451* (2013.01)

(58) Field of Classification Search
USPC .................................................. 330/307, 56
See application file for complete search history.

(56) References Cited

U.S. PATENT DOCUMENTS

| | | | |
|---|---|---|---|
| 10,090,812 B2* | 10/2018 | Modi | .................... H01L 21/565 |
| 2009/0000114 A1 | 1/2009 | Rao et al. | |
| 2012/0044653 A1 | 2/2012 | Morris et al. | |
| 2013/0063913 A1 | 3/2013 | Yoshida et al. | |
| 2013/0301227 A1 | 11/2013 | Kawano | |
| 2016/0093576 A1 | 3/2016 | Chiu et al. | |

OTHER PUBLICATIONS

Written Opinion for International Application No. PCT/JP2018/011572, dated May 22, 2018.

\* cited by examiner

CIRCUIT MODULE

This is a continuation of International Application No. PCT/JP2018/011572 filed on Mar. 23, 2018, which claims priority from Japanese Patent Application No. 2017-067489 filed on Mar. 30, 2017. The contents of these applications are incorporated herein by reference in their entireties.

BACKGROUND OF THE DISCLOSURE

Field of the Disclosure

The present disclosure relates to a circuit module and, more particularly, to a circuit module for a high-frequency circuit.

Description of the Related Art

Patent Document 1 (International Publication No. 2012/101920) describes a circuit module including a substrate, an electronic component mounted on a main surface of the substrate, an insulator layer covering the main surface of the substrate and the electronic component, and a shield layer made of a conductive material. A main surface of the insulator layer is provided with a recess portion. The shield layer covers the main surface of the insulator layer and an inner peripheral surface of the recess portion.
Patent Document 1: International Publication No. 2012/101920

BRIEF SUMMARY OF THE DISCLOSURE

In the circuit module of Patent Document 1, radiation of noise to an outside of the circuit module and ingress of noise into the circuit module are suppressed by the shield layer. However, since the shield layer covers the main surface of the insulator layer and the inner peripheral surface of the recess portion, there is a possibility that noise generated in some electronic components takes a roundabout route to another electronic component via the shield layer.

An object of the present disclosure is to provide a circuit module capable of, while suppressing radiation of noise to an outside and ingress of noise from the outside, reducing a roundabout of noise through a shield layer, thereby improving isolation characteristics between electronic components.

A circuit module of an aspect according to the present disclosure includes a circuit board, a plurality of electronic components, a plurality of conductor posts, a mold layer, and a shield layer. The circuit board includes an electrical insulating layer having a mounting surface, and a ground layer provided on a side of the electrical insulating layer opposite to the mounting surface. The plurality of electronic components includes a first electronic component mounted on the mounting surface and acting as a source of noise, and a second electronic component to be protected from noise generated in the first electronic component. The plurality of conductor posts includes a group of conductor posts arranged so as to traverse between the first electronic component and the second electronic component on the mounting surface and electrically connected to the ground layer. The mold layer is electrically insulating and is formed on the mounting surface so as to seal the plurality of electronic components and the plurality of conductor posts. The shield layer has a slit. The shield layer is formed on a surface on a side of the mold layer opposite to the mounting surface. The slit, with respect to each conductor post included in the group of the conductor posts, in a plan view, passes and extends between the conductor post and the first electronic component, or between the conductor post and the second electronic component.

According to a circuit module of an aspect according to the present disclosure, it is possible to, while suppressing radiation of noise to an outside and ingress of noise from the outside, reduce a roundabout of noise through a shield layer, thereby improving isolation characteristics between electronic components.

DETAILED DESCRIPTION OF THE DISCLOSURE

1. Embodiment

1.1 Configuration

Figure 1:
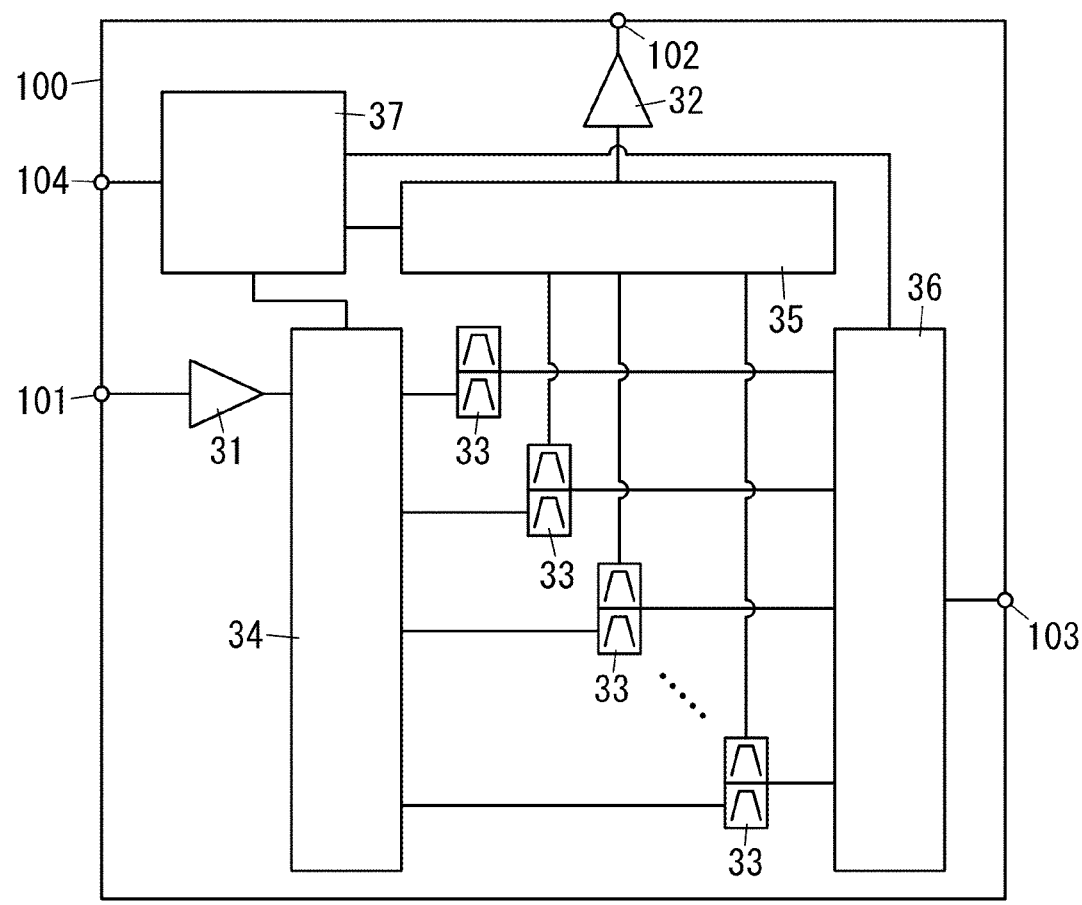
FIG. 1 is a schematic circuit diagram of a circuit module of an embodiment according to the present disclosure.

FIG. 1 is a schematic circuit diagram of a circuit module 100 of an embodiment according to the present disclosure. The circuit module 100 is a circuit module used in a high-frequency circuit. In particular, in the present embodiment, the circuit module 100 is a micro integrated module (front-end module) in which various functional components used in a front-end circuit for wireless communication (wireless front-end circuit) are integrated. The above front-end circuit is a circuit for transmitting a radio signal (transmission signal) received from an external device to an antenna, and transmitting a radio signal (reception signal) received by an antenna to an external device.

As shown in FIG. 1, the circuit module 100 includes an input terminal 101, an output terminal 102, an antenna terminal 103, and a control terminal 104. The input terminal 101 is a terminal connected to an external device, and receiving a transmission signal from the external device. The output terminal 102 is a terminal connected to an external device, and outputting a reception signal to the external device. The antenna terminal 103 is a terminal connected to an external antenna. The control terminal 104 is a terminal for receiving a control signal from an external device.

The circuit module 100 includes various functional components (electronic components) used in a front-end circuit for wireless communication. As shown in FIG. 1, the above electronic components include a power amplifier 31, a low noise amplifier 32, a plurality of duplexers 33, a first switch circuit 34, a second switch circuit 35, an antenna switch circuit 36, and a control circuit 37.

The power amplifier 31 is a circuit for amplifying a transmission signal transmitted from an external device to an antenna. The power amplifier 31 is, for example, a multi-band power amplifier designed so as to operate in a plurality of communication bands. In the power amplifier 31, an input end is electrically connected to the input terminal 101, and an output end is electrically connected to the first switch circuit 34. The power amplifier 31 amplifies a transmission signal received from the input terminal 101, and outputs the amplified transmission signal to the first switch circuit 34.

The low noise amplifier 32 is a circuit for amplifying a reception signal to be transmitted from an antenna to an external device. In the low noise amplifier 32, an input end is electrically connected to the second switch circuit 35, and an output end is electrically connected to the output terminal 102. The low noise amplifier 32 amplifies a reception signal received from the second switch circuit 35, and outputs the amplified reception signal to the output terminal 102.

Each of the plurality of duplexers 33 includes a transmission-side filter and a reception-side filter. The transmission-side filter passes a signal in a transmission frequency band, and attenuates a signal with frequency other than the transmission frequency band. The reception-side filter passes a signal in a reception frequency band, and attenuates a signal with frequency other than the reception frequency band. The duplexer 33 has a function of filtering the signal in the transmission frequency band and the signal in the reception frequency band, and corresponds to a filter circuit. In the present embodiment, the plurality of duplexers 33 has transmission frequency bands and reception frequency bands different from each other. In the duplexer 33, an input terminal of the transmission-side filter is used as a transmission terminal for receiving a transmission signal, and an output terminal of the reception-side filter is used as a reception terminal for outputting a reception signal. Additionally, in the duplexer 33, a connection point between the output terminal of the transmission-side filter and the input terminal of the reception-side filter is used as an antenna connection terminal for connection to an antenna.

Each of the first switch circuit 34, the second switch circuit 35, and the antenna switch circuit 36 is a semiconductor switch circuit. The semiconductor switch circuit is configured with, for example, a Field Effect Transistor (FET), a Micro Electro Mechanical Systems (MEMS) switch, a bipolar transistor, or the like. The first switch circuit 34 includes a circuit for connecting an output end of the power amplifier 31 to one of the transmission terminals of the plurality of duplexers 33. The duplexer 33 to be connected to the power amplifier 31 is selected from the plurality of duplexers 33 by switching connection of the first switch circuit 34. The second switch circuit 35 includes a circuit for connecting an input end of the low noise amplifier 32 to one of the reception terminals of the plurality of duplexers 33. The duplexer 33 to be connected to the low noise amplifier 32 can be selected from the plurality of duplexers 33 by switching connection of the second switch circuit 35. The antenna switch circuit 36 includes a circuit for connecting the antenna terminal 103 to one of the antenna connection terminals of the plurality of duplexers 33. In other words, the antenna switch circuit 36 is a circuit for selecting the duplexer 33 to be connected to the antenna terminal 103 from the plurality of duplexers 33. Note that, when a plurality of communication bands is used at the same time to communicate, the plurality of duplexers 33 is selected at the same time in some cases.

The control circuit 37 receives a control signal from an external device via the control terminal 104, and controls each of the first switch circuit 34, the second switch circuit 35, and the antenna switch circuit 36, based on the control signal. Thus, the control circuit 37 connects the power amplifier 31, the low noise amplifier 32, and the antenna terminal 103 to the specific duplexer 33 among the plurality of duplexers 33. That is, the duplexer 33 suitable for a transmission signal and a reception signal is selected as the specific duplexer 33. The control circuit 37 is, for example, an integrated circuit.

Figure 2A:
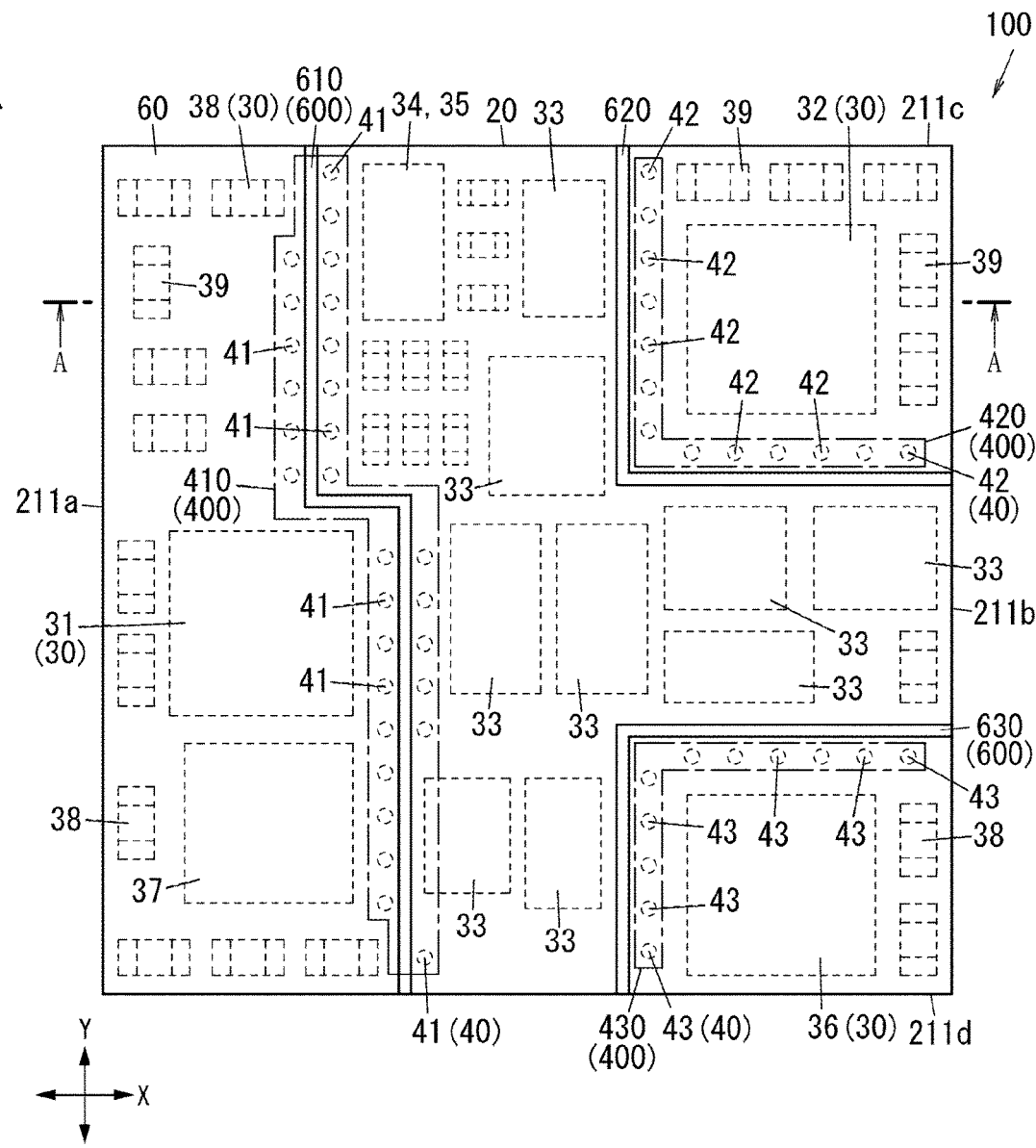
FIG. 2A is a schematic plan view of the circuit module of the above embodiment.

Next, structure (physical structure) of the circuit module 100 will be described with reference to FIG. 2A, FIG. 2B, FIG. 3, and FIG. 4. Note that, in FIG. 2A, FIG. 2B, FIG. 3, and FIG. 4, constituent elements of the circuit module 100 are schematically shown in order to clearly show the structure of the circuit module 100. Additionally, although FIG. 2A and FIG. 4 are schematic plan views of the circuit module 100, in FIG. 4, illustration of some electronic components 30 is omitted in order to explain the structure of the circuit module 100 in more detail. Note that, in the following description, an expression "in a plan view" is synonymous with a meaning of "when the circuit module 100 is viewed from a thickness direction thereof".

Figure 2B:
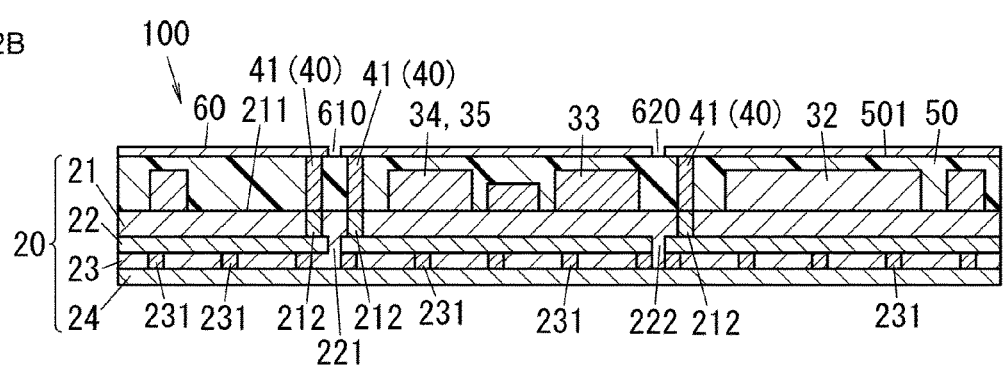
FIG. 2B is a cross-sectional view taken along a line A-A in FIG. 2A.

As shown in FIG. 2A and FIG. 2B, the circuit module 100 includes a circuit board 20, a plurality of the electronic components 30, a plurality of conductor posts 40, a mold layer 50, and a shield layer 60.

Figure 3:
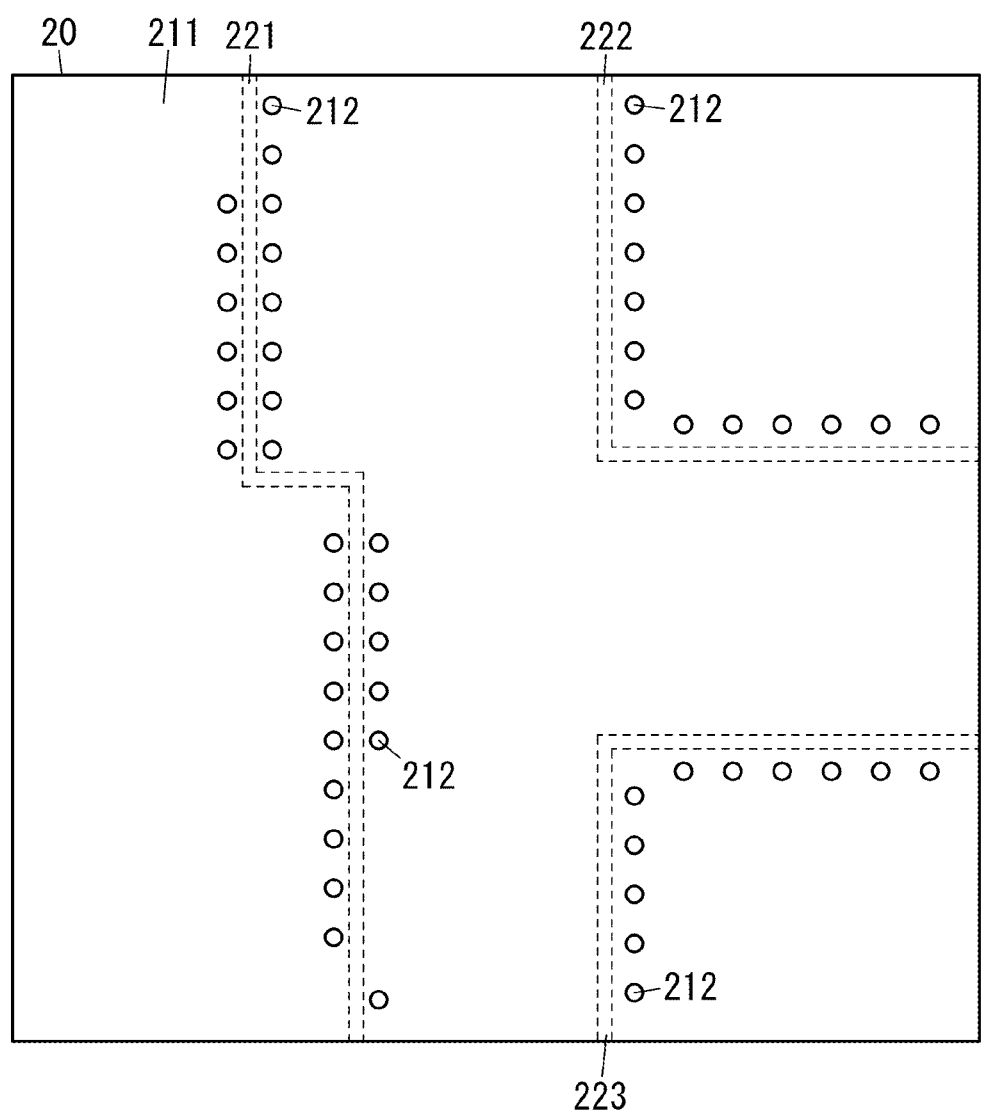
FIG. 3 is a schematic plan view of a circuit board of the circuit module of the above embodiment.
Figure 4:
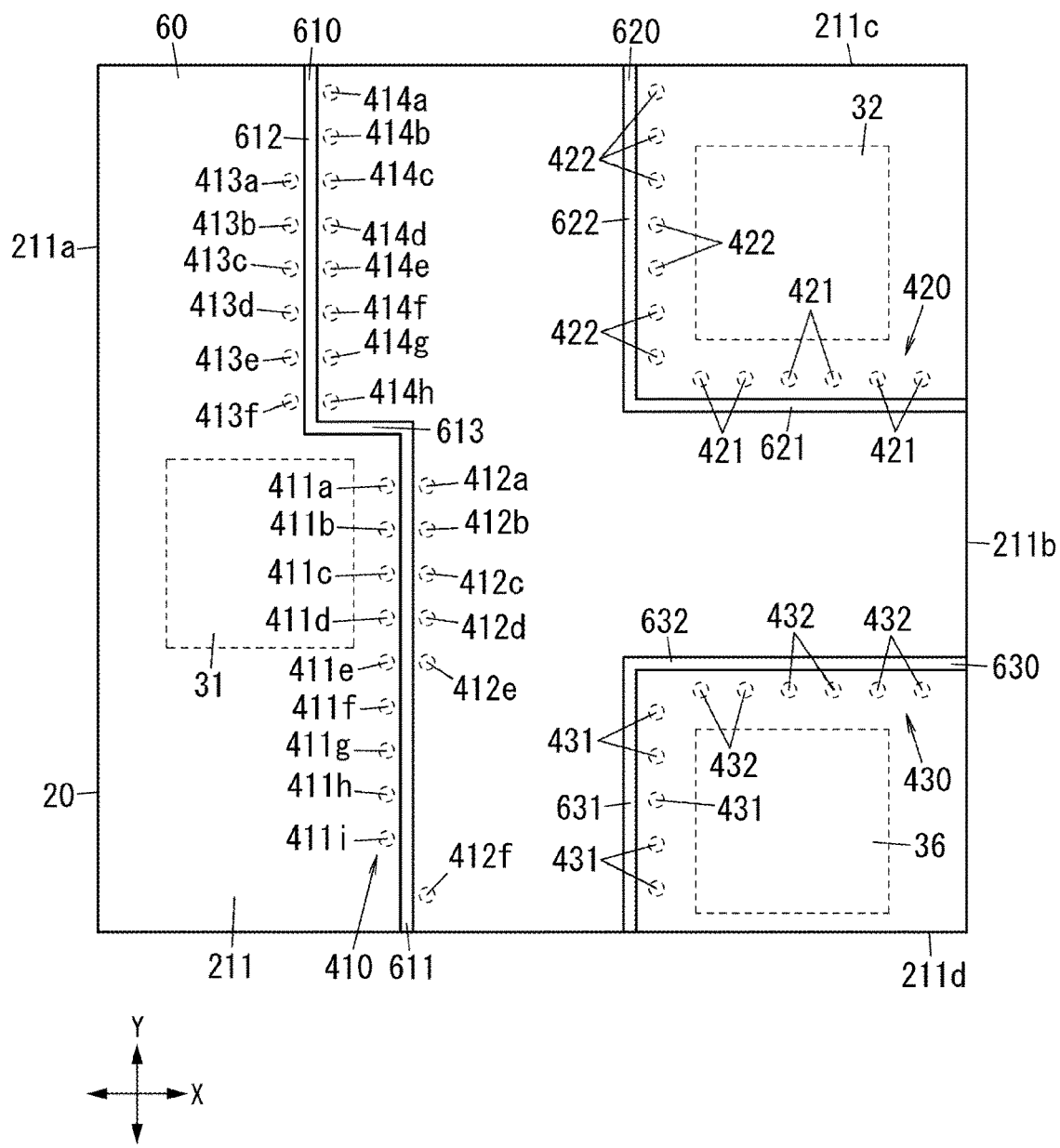
FIG. 4 is a schematic plan view of the circuit module of the above embodiment with a portion thereof omitted.

As shown in FIG. 2A, FIG. 2B, and FIG. 3, the circuit board 20 is a rectangular shaped multilayer substrate (resin multilayer substrate or ceramic multilayer substrate). The circuit board 20 includes an electrical insulating layer (first electrical insulating layer) 21, a ground layer (first ground layer) 22, an electrical insulating layer (second electrical insulating layer) 23, and a ground layer (second ground layer) 24.

The first electrical insulating layer 21 has a mounting surface (upper surface in FIG. 2B) 211. The mounting surface 211 is a substantially flat surface although having micro level irregularities, and the plurality of electronic components 30 is mounted thereon.

The first ground layer 22 is provided on a side of the first electrical insulating layer 21 opposite to the mounting surface 211 (lower side in FIG. 2B). The first ground layer 22 is formed so as to cover the entirety of a surface on a side of the first electrical insulating layer 21 opposite to the mounting surface 211 (lower surface of the circuit module 100 in FIG. 2B). However, as shown in FIG. 3, the first ground layer 22 has three gaps (first gap, second gap, third gap) 221, 222, 223. The first gap 221 is formed so as to be opposed to a slit 610 (see FIG. 2A) described later. In other words, the first gap 221 extends along the slit 610. Further, the second gap 222 is formed so as to be opposed to a slit 620 (see FIG. 2A) described later. In other words, the second gap 222 extends along the slit 620. The third gap 223 is formed so as to be opposed to a slit 630 (see FIG. 2A) described later. In other words, the third gap 223 extends along the slit 630. Thus, propagation of noise traversing each of the gaps 221, 222, 223 is suppressed in the first ground layer 22.

A second electrical insulating layer 23 is provided on a side of the first ground layer 22 opposite to the first electrical insulating layer 21 (lower side in FIG. 2B). The second electrical insulating layer 23 is formed so as to cover the entirety of a surface on the side of the first ground layer 22 opposite to the first electrical insulating layer 21 (lower surface of the circuit module 100 in FIG. 2B). Since the first ground layer 22 has the three gaps 221, 222, 223 as described above, the first electrical insulating layer 21 and the second electrical insulating layer 23 are integrated in an inside of each of the gaps 221, 222, 223.

The second ground layer 24 is provided on a side of the second electrical insulating layer 23 opposite to the first ground layer 22 (lower side in FIG. 2B). The second ground layer 24 is formed so as to cover the entirety of a surface on the side of the second electrical insulating layer 23 opposite to the first ground layer 22 (lower surface of the circuit module 100 in FIG. 2B). A surface on a side of the second ground layer 24 opposite to the second electrical insulating layer 23 (lower surface of the circuit module 100 in FIG. 2B) becomes a bottom surface of the circuit board 20.

As shown in FIG. 2B and FIG. 3, the first electrical insulating layer 21 includes a plurality of vias (through-conductors) 212 for electrically connecting each of the plurality of conductor posts 40 to the first ground layer 22. The second electrical insulating layer 23 has a plurality of vias (through-conductors) 231 for electrically connecting the first ground layer 22 to the second ground layer 24. That is, each of the conductor posts 40 is electrically connected to the first ground layer 22 with the via 212 interposed therebetween, and is electrically connected to the second ground layer 24 by the plurality of vias (through-conductors) 231.

The plurality of electronic components 30 includes the power amplifier 31, the low noise amplifier 32, the plurality of duplexers 33, the first switch circuit 34, the second switch circuit 35, the antenna switch circuit 36, and the control circuit 37. Further, as shown in FIG. 2A, the plurality of electronic components 30 includes a plurality of capacitors 38, and a plurality of inductors 39.

Here, the power amplifier 31 is an electronic component that acts as a source of noise (first electronic component). A frequency of noise generated in the power amplifier 31 depends on a frequency band of a transmission signal to be amplified by the power amplifier 31. For example, the frequency of noise ranges from several hundred MHz to several GHz. On the other hand, the low noise amplifier 32 and the antenna switch circuit 36 are electronic components to be protected (second electronic components) from the noise generated in the power amplifier 31 (first electronic component). As shown in FIG. 2A, the power amplifier 31 is mounted on a side of a first end (left end in FIG. 2A) 211a in a first direction X of the mounting surface 211. The low noise amplifier 32 and the antenna switch circuit 36 are mounted on a side of a second end (right end in FIG. 2A) 211b in the first direction X of the mounting surface 211. In addition, the low noise amplifier 32 and the antenna switch circuit 36 are respectively mounted on a side of a first end (upper end in FIG. 2A) 211c and a side of a second end (lower end in FIG. 2A) 211d in a second direction Y perpendicular to the first direction X of the mounting surface 211. Further, the first switch circuit 34 and the second switch circuit 35 are mounted on the side of the first end 211c in the second direction Y in a vicinity of a center in the first direction X of the mounting surface 211. Further, the control circuit 37 is mounted on the mounting surface 211, between the power amplifier 31 and the second end 211d in the second direction Y of the mounting surface 211. The plurality of capacitors 38 and the plurality of inductors 39 are mounted on the mounting surface 211 as appropriate.

The plurality of conductor posts 40 is provided to electromagnetically shield the second electronic component to be protected from noise generated in the first electronic component, from the first electronic component that acts as a source of noise. By providing the plurality of conductor posts 40, isolation characteristics between the electronic components (between the first electronic component and the second electronic component) can be improved. The plurality of conductor posts 40, as shown in FIG. 2A and FIG. 4, includes three groups 400 (first group 410, second group 420, and third group 430) of the conductor posts 40. Hereinafter, the conductor posts 40 included in the first group 410 are referred to as conductor posts 41, as needed. Similarly, the conductor posts 40 included in the second group 420 are referred to as conductor posts 42, and the conductor posts 40 included in the third group 430 are referred to as conductor posts 43. Each of the conductor posts 40 is made of a conductive material. The conductive material is, for example, metal such as aluminum, copper or iron, or resin such as elastomer containing a conductive material mixed therein. Additionally, a shape of each of the conductor posts 40 is, for example, a cylindrical shape. Any of the plurality of conductor posts 40 is electrically connected to the first ground layer 22 by the via 212. Further, the intervals between the conductor posts 40 in the groups 400 of the conductor posts 40 may be 1/16 or less of a wave length of the noise generated in the power amplifier 31 being the first electronic component. In this manner, it is possible to effectively reduce a possibility that noise passes through gaps between the conductor posts 40. The above-described conductor posts 40 can be disposed by utilizing an empty region in which the electronic components 30 are not mounted on the mounting surface 211. That is, the conductor posts 40 can be disposed without changing arrangement of the electronic components 30. Note that, a lower limit value of the intervals between the conductor posts 40 is not particularly limited, and may be set appropriately according to a desired level of noise reduction.

As shown in FIG. 2A, the first group 410 is a group of the plurality of conductor posts 41 arranged so as to traverse between the power amplifier 31, and the low noise amplifier 32 and the antenna switch circuit 36 on the mounting surface 211. The plurality of conductor posts 41 is provided to protect the second electronic components (in the present embodiment, the low noise amplifier 32 and the antenna switch circuit 36) from the noise generated in the first electronic component (the power amplifier 31). More specifically, as shown in FIG. 4, the plurality of conductor posts 41 is arranged so as to traverse the mounting surface 211 in the second direction Y. Accordingly, the plurality of conductor posts 41 can electromagnetically shield a region of the mounting surface 211 in which the power amplifier 31 is present and a region of the mounting surface 211 in which the low noise amplifier 32 and the antenna switch circuit 36 are present.

As shown in FIG. 4, the plurality of conductor posts 41 includes a plurality of conductor posts 411a, 411b, 411c, 411d, 411e, 411f, 411g, 411h, 411i, a plurality of conductor posts 412a, 412b, 412c, 412d, 412e, and 412f. Also, the plurality of conductor posts 41 includes a plurality of conductor posts 413a, 413b, 413c, 413d, 413e, 413f, a plurality of conductor posts 414a, 414b, 414c, 414d, 414e, 414f, 414g, and 414h.

The plurality of conductor posts 411a to 411i is arranged in a row along the second direction Y from the first end 211c in the second direction Y toward the second end 211*d*, between the low noise amplifier 32 and the antenna switch circuit 36, and the power amplifier 31 in the first direction X of the mounting surface 211. The plurality of conductor posts 411*a* to 411*d* is opposed to the power amplifier 31 in the first direction X. That is, the plurality of conductor posts 411*a* to 411*d* may be disposed adjacent to the power amplifier 31. In other words, there are no electronic components 30 other than the power amplifier 31, between the conductor posts 411*a* to 411*d* and the power amplifier 31. The plurality of conductor posts 412*a* to 412*f* is arranged in a row along the second direction Y from the first end 211*c* toward the second end 211*d*, between the low noise amplifier 32 and the antenna switch circuit 36, and a group of the plurality of conductor posts 411*a* to 411*i* in the first direction X. The conductor posts 412*a* to 412*e* are opposed to the conductor posts 411*a* to 411*e* in the first direction X. Note that, a reason why an interval between the conductor posts 412*e* and 412*f* is larger than an interval between the conductor posts 412*a* and 412*e* is for keeping away from the duplexer 33 (see FIG. 2A). The plurality of conductor posts 413*a* to 413*f* is arranged in a row along the second direction Y, between the first end 211*c* in the second direction Y of the mounting surface 211 and the power amplifier 31. Similarly, the plurality of conductor posts 414*a* to 414*h* is arranged in a row along the second direction Y, between the first end 211*c* in the second direction Y of the mounting surface 211 and the power amplifier 31. However, the plurality of conductor posts 414*a* to 414*h* is closer to the low noise amplifier 32 than the plurality of conductor posts 413*a* to 413*f*. The conductor posts 413*a* to 413*f* and the conductor posts 414*a* to 414*h* are located, in a direction connecting a center of the power amplifier 31 and a center of the low noise amplifier 32, between the power amplifier 31 and the low noise amplifier 32. The conductor posts 413*a* to 413*f* are opposed to the conductor posts 414*c* to 414*h* in the first direction X, respectively.

The second group 420, as shown in FIG. 2A, is a group of the plurality of conductor posts 42 arranged so as to traverse between the power amplifier 31 and the low noise amplifier 32 on the mounting surface 211. The plurality of conductor posts 42 is provided to protect the second electronic component (low noise amplifier 32) from the noise generated in the first electronic component (power amplifier 31). In particular, the group of the plurality of conductor posts 42 included in the second group 420 is disposed between the first group 410 and the low noise amplifier 32 on the mounting surface 211. More specifically, as shown in FIG. 4, the plurality of conductor posts 42 is disposed in an L shape so as to partially surround the low noise amplifier 32. The second group 420 includes a plurality (six in FIG. 4) of conductor posts 421, and a plurality (seven in FIG. 4) of conductor posts 422. The plurality of conductor posts 421 is arranged in a row along the first direction X, between the power amplifier 31 and the low noise amplifier 32 in the second direction Y of the mounting surface 211. Some of the plurality of conductor posts 421 are opposed to the low noise amplifier 32 in the second direction Y. The plurality of conductor posts 422 is arranged in a row along the second direction Y, between the power amplifier 31 and the low noise amplifier 32 in the first direction X of the mounting surface 211. Some of the plurality of conductor posts 422 are opposed to the low noise amplifier 32 in the first direction X. Each of the conductor posts 42 is disposed adjacent to the low noise amplifier 32. In other words, there are no electronic components 30 other than the low noise amplifier 32, between the conductor posts 42 and the low noise amplifier 32. Note that, in FIG. 2A and FIG. 4, the number of conductor posts 42 is 13, but is not limited thereto.

As shown in FIG. 2A, the third group 430 is a group of the plurality of conductor posts 43 that is arranged so as to traverse between the power amplifier 31 and the antenna switch circuit 36 on the mounting surface 211. The plurality of conductor posts 43 is provided to protect the second electronic component (antenna switch circuit 36) from the noise generated in the first electronic component (power amplifier 31). In particular, the group of the plurality of conductor posts 43 included in the third group 430 is disposed between the first group 410 and the antenna switch circuit 36 on the mounting surface 211. More specifically, as shown in FIG. 4, the plurality of conductor posts 43 is arranged in an L shape so as to partially surround the antenna switch circuit 36. The third group 430 includes a plurality (five in FIG. 4) of conductor posts 431, and a plurality (six in FIG. 4) of conductor posts 432. The plurality of conductor posts 431 is arranged in a row along the second direction Y, between the power amplifier 31 and the antenna switch circuit 36 in the first direction X of the mounting surface 211. Some of the plurality of conductor posts 431 are opposed to the antenna switch circuit 36 in the first direction X. The plurality of conductor posts 432 is arranged in a row along the first direction X, between the power amplifier 31 and the antenna switch circuit 36 in the second direction Y of the mounting surface 211. Some of the plurality of conductor posts 432 are opposed to the antenna switch circuit 36 in the second direction Y. Each of the conductor posts 43 is disposed adjacent to the antenna switch circuit 36. In other words, there are no electronic components 30 other than the antenna switch circuit 36, between the conductor posts 43 and the antenna switch circuit 36. Note that, in FIG. 2A and FIG. 4, the number of conductor posts 43 is 11, but is not limited thereto.

The plurality of conductor posts 40, as described above, includes the three groups, that is, the group (first group) 410 of conductor posts 41, the group (second group) 420 of conductor posts 42, and a group (third group) 430 of conductor posts 43. Here, as shown in FIG. 4, the first group 410 is closer to the first electronic component (power amplifier 31) than the second group 420 and the third group 430. When the plurality of conductor posts 40 includes a plurality of groups, a group of conductor posts including the conductor posts 40 closest to the first electronic component is referred to as a group of main conductor posts (or a group of first conductor posts), and a group of the conductor posts 40 other than the group of main conductor posts is referred to as a group of sub conductor posts. That is, the group of sub conductor posts (or a group of second conductor posts) is defined as a group of conductor posts disposed between the group of main conductor posts and the second electronic component on the mounting surface 211 and electrically connected to the ground layer.

As shown in FIG. 2B, the mold layer 50 is formed on the mounting surface 211. The mold layer 50 is electrically insulating and seals the plurality of electronic components 30 and the plurality of conductor posts 40. The mold layer 50 is formed so as to cover the entirety of the mounting surface 211. The mold layer 50 is formed of, for example, an electrical insulating resin (for example, an epoxy resin). Further, the mold layer 50 is formed such that a surface 501 opposite to the mounting surface 211 (upper surface in FIG. 2B) is flat. Additionally, the mold layer 50 is formed so that tips of the plurality of conductor posts 40 are exposed to the surface 501.

The shield layer 60 is provided to suppress radiation of noise from an inside to an outside of the circuit module 100 and ingress of noise from the outside to the inside of the circuit module 100. The shield layer 60 is, as shown in FIG. 2B, formed on a side of the surface 501 of the mold layer 50 opposite to the mounting surface 211. The shield layer 60 covers the entirety of the surface 501 of the mold layer 50. In particular, the shield layer 60 is formed on the surface 501 so as to contact the tips of the plurality of conductor posts 40. Thus, the shield layer 60 is electrically connected to the second ground layer 24 with the plurality of conductor posts 40, the plurality of vias 212, and the first ground layer 22 interposed therebetween. As described above, since the shield layer 60 is electrically connected to the ground layer 22 by the plurality of conductor posts 40, there is no need to provide a new grounding wiring for the shield layer 60.

Additionally, as shown in FIG. 2A and FIG. 4, the shield layer 60 includes three slits 600 (slit 610, slit 620, and slit 630). Each of the slits 600, with respect to each of the conductor posts 40 included in the groups 400 of conductor posts 40, in a plan view, passes and extends between the conductor posts 40 and the first electronic component, or between the conductor posts 40 and the second electronic component. Here, "between the conductor posts 40 and the first electronic component" means "between a center line perpendicular to a straight line connecting the first electronic component and the second electronic component and passing through the conductor posts 40, and a center line perpendicular to the straight line and passing through the first electronic component". Also, "between the conductor posts 40 and the second electronic component" means "between the center line perpendicular to the straight line connecting the first electronic component and the second electronic component and passing through the conductor post 40, and a center line perpendicular to the straight line and passing through the second electronic component".

The shield layer 60 is formed of a material having conductivity. The conductive material is, for example, metal such as aluminum, copper or iron, or resin such as elastomer containing a conductive material mixed therein. Further, the shield layer 60 can be formed by a well-known thin film formation technique such as sputtering. Further, the slits 600 are formed by partially removing the shield layer 60 using a dicer, a laser, or the like. That is, the slits 600 can be formed only by processing the shield layer 60, and there is no need to process the mold layer 50. Thus, a manufacturing cost can be reduced.

The slit 610 is formed along the first group 410. That is, the slit 610 corresponds to the first group 410. The slit 610 traverses between the power amplifier 31, and the low noise amplifier 32 and the antenna switch circuit 36. More specifically, as shown in FIG. 4, the slit 610 has a Z shape that traverses the shield layer 60 in the second direction Y. The slit 610 includes a first portion 611, a second portion 612, and a third portion 613. The first portion 611 is linear and extending along the second direction Y of the mounting surface 211, and passes between a set of the conductor posts 411a to 411i and a set of the conductor posts 412a to 412f. That is, the first portion 611, with respect to the conductor posts 41 (411a to 411i) of the first group 410, in a plan view, passes between the conductor posts 41 and the antenna switch circuit 36 (that is, through a side of the antenna switch circuit 36 with respect to the conductor posts 41). In addition, the first portion 611, with respect to the conductor posts 41 (412a to 412f) of the first group 410, in a plan view, passes between the conductor posts 41 and the power amplifier 31 (that is, through a side of the power amplifier 31 with respect to the conductor posts 41). The second portion 612 is linear and extending along the second direction Y of the mounting surface 211, and passes between a set of the conductor posts 413a to 413f and a set of the conductor posts 414a to 414h. That is, the second portion 612, with respect to the conductor posts 41 (413a to 413f) of the first group 410, in a plan view, passes between the conductor posts 41 and the low noise amplifier 32 (that is, through a side of the low noise amplifier 32 with respect to the conductor posts 41). In addition, the second portion 612, with respect to the conductor posts 41 (414a to 414h) of the first group 410, in a plan view, passes between the conductor posts 41 and the power amplifier 31 (that is, through the side of the power amplifier 31 with respect to the conductor posts 41). The third portion 613 connects the first portion 611 and the second portion 612. As described above, the slit 610 traverses, along the group 410 of conductor posts, between the first electronic component (power amplifier 31) and the second electronic components (low noise amplifier 32 and antenna switch circuit 36). Further, the slit 610 is open at both ends. That is, in the shield layer 60, a portion covering the surface 501 of the mold layer 50 is divided by the slit 610.

The slit 620 is formed along the second group 420. That is, the slit 620 corresponds to the second group 420. The slit 620 traverses between the power amplifier 31 and the low noise amplifier 32. More specifically, as shown in FIG. 4, the slit 620 has an L shape that partially surrounds the low noise amplifier 32. The slit 620 includes a first portion 621 and a second portion 622. The first portion 621 is linear and extending along the first direction X of the mounting surface 211, and with respect to the conductor posts 421 of the second group 420, in a plan view, passes between the conductor posts 421 and the first electronic component (power amplifier 31) (that is, through a side of the first electronic component with respect to the conductor posts 421). The second portion 622 is linear and extending along the second direction Y of the mounting surface 211, and with respect to the conductor posts 422 of the second group 420, in a plan view, passes between the conductor posts 422 and the first electronic component (power amplifier 31) (that is, through a side of the first electronic component with respect to the conductor posts 422). As described above, the slit 620 traverses between the first electronic component (power amplifier 31) and the second electronic component (low noise amplifier 32) along the group 420 of conductor posts. Further, the slit 620 is open at both ends. That is, in the shield layer 60, the portion covering the surface 501 of the mold layer 50 is divided by the slit 620.

The slit 630 is formed along the third group 430. That is, the slit 630 corresponds to the third group 430. The slit 630 traverses between the power amplifier 31 and the antenna switch circuit 36. More specifically, as shown in FIG. 4, the slit 630 has an L shape that partially surrounds the antenna switch circuit 36. The slit 630 includes a first portion 631 and a second portion 632. The first portion 631 is linear and extending along the second direction Y of the mounting surface 211, and with respect to the conductor posts 431 of the third group 430, in a plan view, passes between the conductor posts 431 and the first electronic component (power amplifier 31) (that is, through a side of the first electronic component with respect to the conductor posts 431). The second portion 632 is linear and extending along the first direction X of the mounting surface 211, and with respect to the conductor posts 432 of the third group 430, in a plan view, passes between the conductor posts 432 and the first electronic component (power amplifier 31) (that is, through a side of the first electronic component with respect to the conductor posts 432). In this way, the slit 630, along the group 430 of conductor posts, traverses between the first electronic component (the power amplifier 31) and the second electronic component (the antenna switch circuit 36). Further, the slit 630 is open at both ends. That is, in the shield layer 60, the portion covering the surface 501 of the mold layer 50 is divided by the slit 630.

In this manner, the shield layer 60 includes the three slits 600, that is, the slit 610, the slit 620, and the slit 630. Here, the slit 610 corresponding to the first group 410 to be the group of first conductor posts is referred to as a first slit (or a main slit), and the slit 620 and the slit 630 respectively corresponding to the second group 420 and the third group 430 to be the groups of second conductor posts are referred to as second slits (or subslits). That is, each of the second slits is defined as a slit, with respect to each of the second conductor posts included in the group of second conductor posts, in a plan view, that passes between the second conductor posts and the group of first conductor posts, or between the second conductor posts and the second electronic component.

1.2 Summary

In the circuit module 100 of the present embodiment, the shield layer 60 includes the slit 610 that traverses between the power amplifier 31, and the low noise amplifier 32 and the antenna switch circuit 36. In other words, the slit 610 exists between a portion covering the power amplifier 31 and portions respectively covering the low noise amplifier 32 and the antenna switch circuit 36, in the shield layer 60. Thus, the noise generated in the power amplifier 31 is suppressed from taking a roundabout route to the low noise amplifier 32 and the antenna switch circuit 36 through the shield layer 60. In particular, in the present embodiment, since both the ends of the slit 610 are open, the portion covering the power amplifier 31 is separated from the portions respectively covering the low noise amplifier 32 and the antenna switch circuit 36, in the shield layer 60. Thus, the noise generated in the power amplifier 31 is further suppressed from taking the roundabout route to the low noise amplifier 32 and the antenna switch circuit 36 through the shield layer 60. Further, when the slit 610 is formed on the shield layer 60, there is a possibility that the noise generated in the power amplifier 31 is radiated to an outside of the circuit module 100 through the slit 610. However, the slit 610, with respect to the respective conductor posts 41 (411a to 411i, 413a to 413f) included in the first group 410, in a plan view, passes between the conductor posts 41 and the second electronic components (low noise amplifier 32 and antenna switch circuit 36). In other words, the slit 610, with respect to the respective conductor posts 41 (411a to 411i, 413a to 413f) included in the first group 410, in a plan view, passes through a side of the conductor posts 41 opposite to the power amplifier 31.

Thus, the first group 410 causes the noise to flow to the first ground layer 22. That is, the group 410 of the conductor posts 41 suppresses the radiation of noise to the outside. Thus, it is possible to suppress the radiation of noise from the power amplifier 31 to the outside. In particular, the slit 610 traverses between the power amplifier 31, and the low noise amplifier 32 and the antenna switch circuit 36, along the group 410 of conductor posts. That is, the slit 610 is closer to the group 410 of conductor posts than the power amplifier 31, the low noise amplifier 32, and the antenna switch circuit 36. In this way, as the slit 610 is closer to the group 410 of conductor posts, an effect of suppressing the radiation of noise to the outside and the ingress of noise from the outside is enhanced.

The first gap 221 of the first ground layer 22 extends along the slit 610. Thus, similar to the slit 610, the first gap 221 traverses between the first electronic component (power amplifier 31) and the second electronic components (low noise amplifier 32 and antenna switch circuit 36), along the group 410 of conductor posts. That is, the first gap 221 exists between a portion corresponding to the power amplifier 31 and a portion corresponding to the low noise amplifier 32 and the antenna switch circuit 36 in the first ground layer 22. Thus, the noise generated in the power amplifier 31 is suppressed from taking a roundabout route to the low noise amplifier 32 and the antenna switch circuit 36 through the first ground layer 22.

Further, the shield layer 60 has the slit 620 traversing between the power amplifier 31 and the low noise amplifier 32. In other words, the slit 620 exists between the portion covering the power amplifier 31 and the portion covering the low noise amplifier 32 in the shield layer 60. Thus, the noise generated in the power amplifier 31 is suppressed from taking a roundabout route to the low noise amplifier 32 through the shield layer 60. In particular, in the present embodiment, since both the ends of the slit 620 are open, the portion covering the power amplifier 31 is separated from the portion covering the low noise amplifier 32, in the shield layer 60. Thus, the noise generated in the power amplifier 31 is further suppressed from taking the roundabout route to the low noise amplifier 32 through the shield layer 60. When the slit 620 is formed on the shield layer 60, there is a possibility that noise enters inside the circuit module 100 through the slit 620 to reach the low noise amplifier 32. However, the slit 620, with respect to the respective conductor posts 42 included in the second group 420, in a plan view, passes between the conductor posts 42 and the power amplifier 31 (that is, through a side of the conductor posts 42 opposite to the low noise amplifier 32).

Thus, the noise passing through the slit 620 and entering into the circuit module 100 is caused to flow to the first ground layer 22 by the conductor posts 42 of the second group 420. That is, the group 420 of conductor posts 42 suppresses the ingress of noise from the outside. Thus, the low noise amplifier 32 can be protected from the noise. In particular, the slit 620 traverses between the power amplifier 31 and the low noise amplifier 32, along the group 420 of conductor posts. That is, the slit 620 is closer to the group 420 of conductor posts than the power amplifier 31 and the low noise amplifier 32. In this way, as the slit 620 is closer to the group 420 of conductor posts, the effect of suppressing the radiation of noise to the outside and ingress of noise from the outside is enhanced.

The second gap 222 in the first ground layer 22 extends along the slit 620. Thus, the second gap 222, similar to the slit 620, along the group 420 of conductor posts, traverses between the first electronic component (power amplifier 31) and the second electronic component (low noise amplifier 32). That is, the second gap 222 exists between the portion corresponding to the power amplifier 31 and a portion corresponding to the low noise amplifier 32 in the first ground layer 22. Thus, the noise generated in the power amplifier 31 is suppressed from taking a roundabout route to the low noise amplifier 32 through the first ground layer 22.

In addition, the shield layer 60 has the slit 630 traversing between the power amplifier 31 and the antenna switch circuit 36. In other words, the slit 630 exists between the portion covering the power amplifier 31 and the portion covering the antenna switch circuit 36 in the shield layer 60. Thus, the noise generated in the power amplifier 31 is suppressed from taking a roundabout route to the antenna switch circuit 36 through the shield layer 60. In particular, in the present embodiment, since both ends of the slit 630 are open, the portion covering the power amplifier 31 is separated from the portion covering the antenna switch circuit 36, in the shield layer 60. Thus, the noise generated in the power amplifier 31 is further suppressed from taking the roundabout route to the antenna switch circuit 36 through the shield layer 60. When the slit 630 is formed on the shield layer 60, there is a possibility that noise enters inside the circuit module 100 through the slit 630 to reach the antenna switch circuit 36. However, the slit 630, with respect to the respective conductor posts 43 included in the third group 430, in a plan view, passes between the conductor posts 43 and the power amplifier 31 (that is, through a side of the conductor posts 43 opposite to the antenna switch circuit 36).

Thus, the noise passing through the slit 630 and entering into the circuit module 100 is caused to flow to the first ground layer 22 by the conductor posts 43 of the third group 430. That is, the group 430 of the conductor posts 43 suppresses the ingress of noise from the outside. Thus, the antenna switch circuit 36 can be protected from the noise. In particular, the slit 630 traverses, along the group 430 of conductor posts, between the power amplifier 31 and the antenna switch circuit 36. That is, the slit 630 is closer to the group 430 of conductor posts than the power amplifier 31 and the antenna switch circuit 36. In this way, as the slit 630 is closer to the group 430 of conductor posts, the effect of suppressing the radiation of noise to the outside and ingress of noise from the outside is enhanced.

The third gap 223 in the first ground layer 22 extends along the slit 630. Thus, similar to the slit 630, the third gap 223 traverses between the first electronic component (power amplifier 31) and the second electronic components (antenna switch circuit 36), along the group 430 of conductor posts. That is, the third gap 223 exists between the portion corresponding to the power amplifier 31 and a portion corresponding to the antenna switch circuit 36 in the first ground layer 22. Thus, the noise generated in the power amplifier 31 is suppressed from taking the roundabout route to the antenna switch circuit 36 through the first ground layer 22.

In addition, in the circuit module 100, the plurality of conductor posts 40 includes, in addition to the first group 410 to be the group of main conductor posts, the second group 420 and the third group 430 to be the groups of sub conductor posts. Thus, compared to a case where the plurality of conductor posts 40 includes only the group of main conductor posts, further improvement in isolation characteristics between the first electronic component and the second electronic component can be achieved. In addition, in the circuit module 100, the shield layer 60 includes, in addition to the slit 610 to be the first slit, the slit 620 and the slit 630 to be the second slits. Thus, compared to a case where the shield layer 60 includes only the first slit, it is possible to further suppress a roundabout of the noise through the shield layer 60.

As described above, in the circuit module 100 of the present embodiment, the plurality of conductor posts 40 includes the groups 400 (410, 420, 430) of conductor posts. The groups 400 (410, 420, 430) of conductor posts are arranged so as to traverse between the first electronic component (power amplifier 31) and the second electronic components (low noise amplifier 32, antenna switch circuit 36) on the mounting surface 211, and are electrically connected to the ground layer 22. Thus, it is possible to improve the isolation characteristics between the first electronic component and the second electronic components. Further, the shield layer 60 has the slits 600 (610, 620, 630). The slits 600, with respect to the respective conductor posts 40 included in the groups 400 of conductor posts, in a plan view, pass and extend between the conductor posts 40 and the first electronic component (power amplifier 31), or between the conductor posts 40 and the second electronic components (low noise amplifier 32, antenna switch circuit 36). That is, the slits 600 traverse between the first electronic component (the power amplifier 31) and the second electronic components (the low noise amplifier 32, the antenna switch circuit 36), along the groups 400 of conductor posts. Thus, the roundabout of the noise through the shield layer 60 can be reduced. Additionally, the groups (410, 420, 430) of conductor posts suppress the radiation of noise to the outside and the ingress of noise from the outside through the slits (610, 620, 630). Thus, according to the circuit module 100 of the present embodiment, it is possible to, while suppressing the radiation of noise to the outside and the ingress of noise from the outside, reduce the roundabout of noise through the shield layer 60, thereby improving the isolation characteristics between electronic components.

2. Modification Examples

The embodiment described above is only one of various embodiments of the present disclosure. Further, the above embodiment can be variously modified in accordance with design or the like, as long as the object of the present disclosure can be achieved. Modification examples of the above embodiment will be described below.

2.1 First Modification Example

Figure 5:
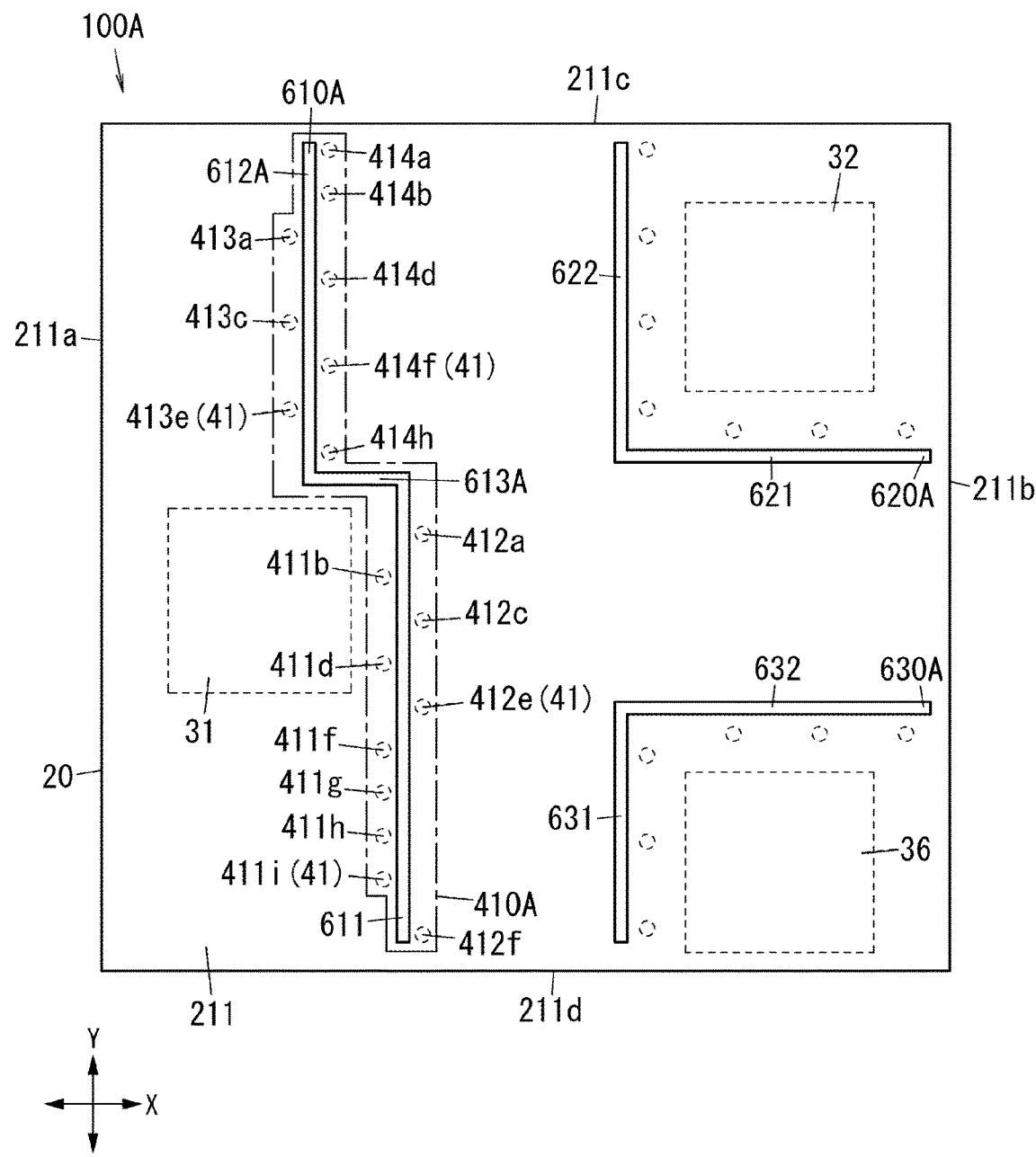
FIG. 5 is a schematic plan view of a circuit module of a first modification example of the above embodiment.

FIG. 5 shows a circuit module 100A according to a first modification example. In the circuit module 100A, the plurality of conductor posts 40 includes a first group 410A, a second group 420A, and a third group 430A. The first group 410A is a group of the conductor posts 41 arranged so as to traverse between the power amplifier 31, and the low noise amplifier 32 and the antenna switch circuit 36 on the mounting surface 211, similar to the first group 410, but the number of the conductor posts 41 is smaller compared to the first group 410. The conductor posts 41 of the first group 410A includes a plurality of conductor posts 411b, 411d, 411f, 411g, 411h, 411i, a plurality of conductor posts 412a, 412c, 412e, and 412f. In addition, the conductor posts 41 of the first group 410A include a plurality of conductor posts 413a, 413c, 413e, a plurality of conductor posts 414a, 414b, 414d, 414f, and 414h. In the first group 410A, the conductor posts 41 are arranged so as not to be opposed to each other, in the first direction X of the mounting surface 211. However, the intervals between the conductor posts 41 are set to ¹/₁₆ or less of the wave length of the noise generated in the power amplifier 31. The second group 420A, similar to the second group 420, is a group of the plurality of conductor posts 42 arranged so as to traverse between the power amplifier 31 and the low noise amplifier 32 on the mounting surface 211. The second group 420A includes a plurality (three in FIG. 5) of conductor posts 421, and a plurality (four in FIG. 5) of conductor posts 422. That is, in the second group 420A, the number of the conductor posts 42 (421, 422) is smaller compared to the second group 420. However, the intervals between the conductor posts 42 are set to ¹/₁₆ or less of the wave length of the noise generated in the power amplifier 31. Similar to the third group 430, the third group 430A is a group of the plurality of conductor posts 43 arranged so as to traverse between the power amplifier 31 and the antenna switch circuit 36 on the mounting surface 211. The third group 430 includes the plurality (three in FIG. 5) of conductor posts 431, and the plurality (three in FIG. 5) of conductor posts 432. That is, in the third group 430A, the number of conductor posts 43 (431, 432) is smaller compared to the third group 430. However, the intervals between the conductor posts 43 are set to ⅙₆ or less of the wave length of the noise generated in the power amplifier 31.

In addition, in the circuit module 100A, the shield layer 60 includes a slit 610A, a slit 620A, and a slit 630A. Similar to the slit 610, the slit 610A includes the first portion 611, the second portion 612A, and the third portion 613A. However, both ends of the slit 610A are not open. That is, in the shield layer 60, the portion covering the surface 501 of the mold layer 50 is not divided by the slit 610A. The slit 620A, similar to the slit 620, includes the first portion 621 and the second portion 622. However, both ends of the slit 620A are not open. That is, in the shield layer 60, the portion covering the surface 501 of the mold layer 50 is not divided by the slit 620A. The slit 630A, similar to the slit 630, includes the first portion 631 and the second portion 632. However, both ends of the slit 630A are not open. That is, in the shield layer 60, the portion covering the surface 501 of the mold layer 50 is not divided by the slit 630A.

Also in the circuit module 100A described above, similar to the circuit module 100, it is possible to, while suppressing the radiation of noise to the outside and the ingress of noise from the outside, reduce the roundabout of noise through the shield layer 60, thereby improving the isolation characteristics between electronic components. Further, when intervals between the conductor posts 40 (41, 42, 43) are ⅙₆ or less of the wave length of the noise generated in the power amplifier 31, an effect of the groups 400 of conductor posts can be maintained. That is, it is possible to maintain an effect of suppressing the radiation of noise to the outside and the ingress of noise from the outside. Thus, in the circuit module 100A, it is possible to, while maintaining the effect of suppressing the radiation of noise to the outside and the ingress of noise from the outside, reduce the number of the conductor posts 40, and reduce a manufacturing cost and a region required for installation of the conductor posts 40.

2.2 Second Modification Example

Figure 6:
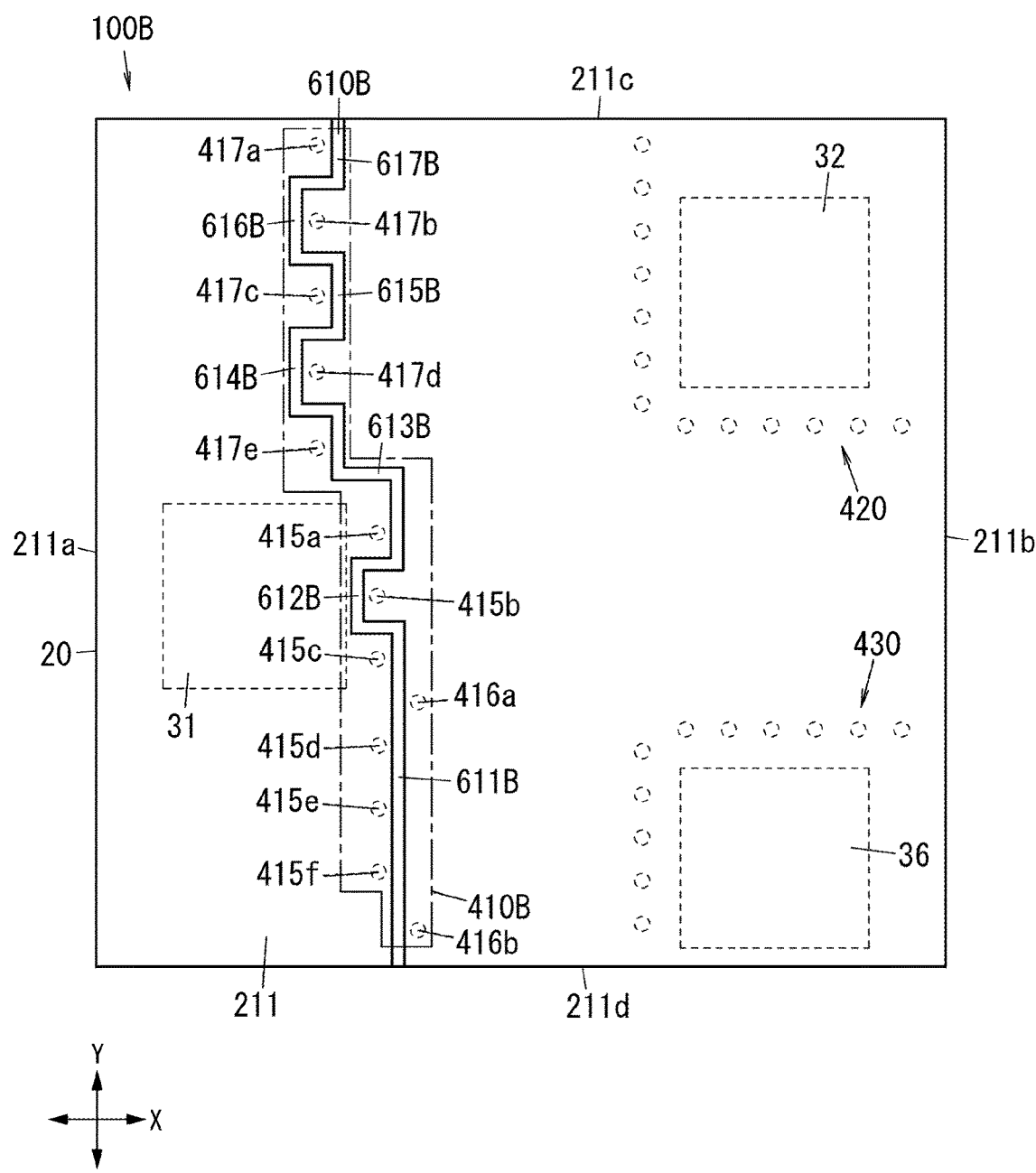
FIG. 6 is a schematic plan view of a circuit module of a second modification example of the above embodiment.

FIG. 6 shows a circuit module 100B according to a second modification example. In the circuit module 100B, the plurality of conductor posts 40 includes a first group 410B, the second group 420, and the third group 430.

Similar to the first group 410, the first group 410B is a group of the plurality of conductor posts 41 arranged so as to traverse between the power amplifier 31, and the low noise amplifier 32 and the antenna switch circuit 36 on the mounting surface 211. The plurality of conductor posts 41 includes a plurality (six in FIG. 6) of conductor posts 415*a*, 415*b*, 415*c*, 415*d*, 415*e*, 415*f*, a plurality (two in FIG. 6) of conductor posts 416*a* and 416*b*. The plurality of conductor posts 41 further includes a plurality (five in FIG. 6) of conductor posts 417*a*, 417*b*, 417*c*, 417*d*, 417*e*. The plurality of conductor posts 415*a* to 415*f* is arranged in a row along the second direction Y from the first end 211*c* toward the second end 211*d* in the second direction Y, between the low noise amplifier 32 and the antenna switch circuit 36, and the power amplifier 31 in the first direction X of the mounting surface 211. The plurality of conductor posts 415*a* to 415*c* is opposed to the power amplifier 31 in the first direction X. That is, the plurality of conductor posts 415*a* to 415*c* is disposed adjacent to the power amplifier 31. In other words, there are no electronic components 30 other than the power amplifier 31, between the conductor posts 415*a* to 415*c* and the power amplifier 31. The plurality of conductor posts 416*a* and 416*b* is arranged in a row along the second direction Y from the first end 211*c* toward the second end 211*d*, between the low noise amplifier 32 and the antenna switch circuit 36, and the group of conductor posts 415*a* to 415*f* in the first direction X. The conductor post 416*a* is located between the conductor posts 415*c* and 415*d* in the second direction Y. The conductor post 416*b* is located between the conductor post 415*f* and the second end 211*d* in the second direction Y. The plurality of conductor posts 417*a* to 417*e* is arranged in a row along the second direction Y, between the first end 211*c* in the second direction Y of the mounting surface 211 and the power amplifier 31. In the first group 410B, an interval between the two adjacent conductor posts is set to ⅙₆ or less of the wave length of the noise generated in the power amplifier 31.

Further, in the circuit module 100B, the shield layer 60 includes a slit 610B, but does not include the slit 620 and the slit 630. In other words, the shield layer 60 has the first slit, but does not have the second slit. The slit 610B is formed along the first group 410B. That is, the slit 610B corresponds to the first group 410B. The slit 610B traverses between the power amplifier 31, and the low noise amplifier 32 and the antenna switch circuit 36. More specifically, the slit 610B includes a first portion 611B, a second portion 612B, a third portion 613B, a fourth portion 614B, a fifth portion 615B, a sixth portion 616B, and a seventh portion 617B.

The first portion 611B passes and extends, from the second end 211*d* in the second direction Y of the mounting surface 211, between a set of the conductor posts 415*c* to 415*f* and a set of the conductor posts 416*a* and 416*b*. That is, the first portion 611B, with respect to the conductor posts 41 (415*c* to 415*f*) of the first group 410B, passes between the conductor posts 41 and the antenna switch circuit 36. Further, the first portion 611B, with respect to the conductor posts 41 (416*a*, 416*b*) of the first group 410B, passes between the conductor posts 41 and the power amplifier 31. The second portion 612B, from the first portion 611B, passes and extends between the conductor post 415*b* and the power amplifier 31. The third portion 613B, from the second portion 612B, passes and extends between the conductor post 415*a*, and the low noise amplifier 32 and the antenna switch circuit 36, and between the conductor post 417*e* and the low noise amplifier 32. The fourth portion 614B, from the third portion 613B, passes and extends between the conductor post 417*d* and the power amplifier 31. The fifth portion 615B, from the fourth portion 614B, passes and extends between the conductor post 417*c* and the low noise amplifier 32. The sixth portion 616B, from the fifth portion 615B, passes and extends between the conductor post 417*b* and the power amplifier 31. The seventh portion 617B, from the sixth portion 616B, passes and extends between the conductor post 417*a* and the low noise amplifier 32.

Thus, the slit 610B has the portions (611B to 613B) that pass between one of the two adjacent conductor posts 41 and the first electronic component (power amplifier 31), and between another of the two adjacent conductor posts 41 and the second electronic component (antenna switch circuit 36). Further, the slit 610B has the portions (613B to 617B) that pass between one of the two adjacent conductor posts 41 and the first electronic component (power amplifier 31), and between another of the two adjacent conductor posts 41 and the second electronic component (low noise amplifier 32). In this manner, in the portions that pass between the one of the two adjacent conductor posts 41 and the first electronic component and between the other of the two adjacent conductor posts 41 and the second electronic component, the two conductor posts 41 adjacent to each other are located on both sides of the slit 610B respectively. Thus, as in the circuit module 100, an effect is obtained similar to that in the case where the set of conductor posts 413a to 413f and the set of conductor posts 414a to 414h are disposed on both the sides of the slit 610. That is, it is possible to, while maintaining the effect of suppressing the radiation of noise to the outside and the ingress of noise from the outside, reduce the number of the conductor posts 40 (41), and reduce the manufacturing cost and the region required for installation of the conductor posts 40 (41).

Also in the circuit module 100B described above, similar to the circuit module 100, it is possible to, while suppressing the radiation of noise to the outside and the ingress of noise from the outside, reduce the roundabout of noise through the shield layer 60, thereby improving the isolation characteristics between the electronic components.

2.3 Third Modification Example

Figure 7:
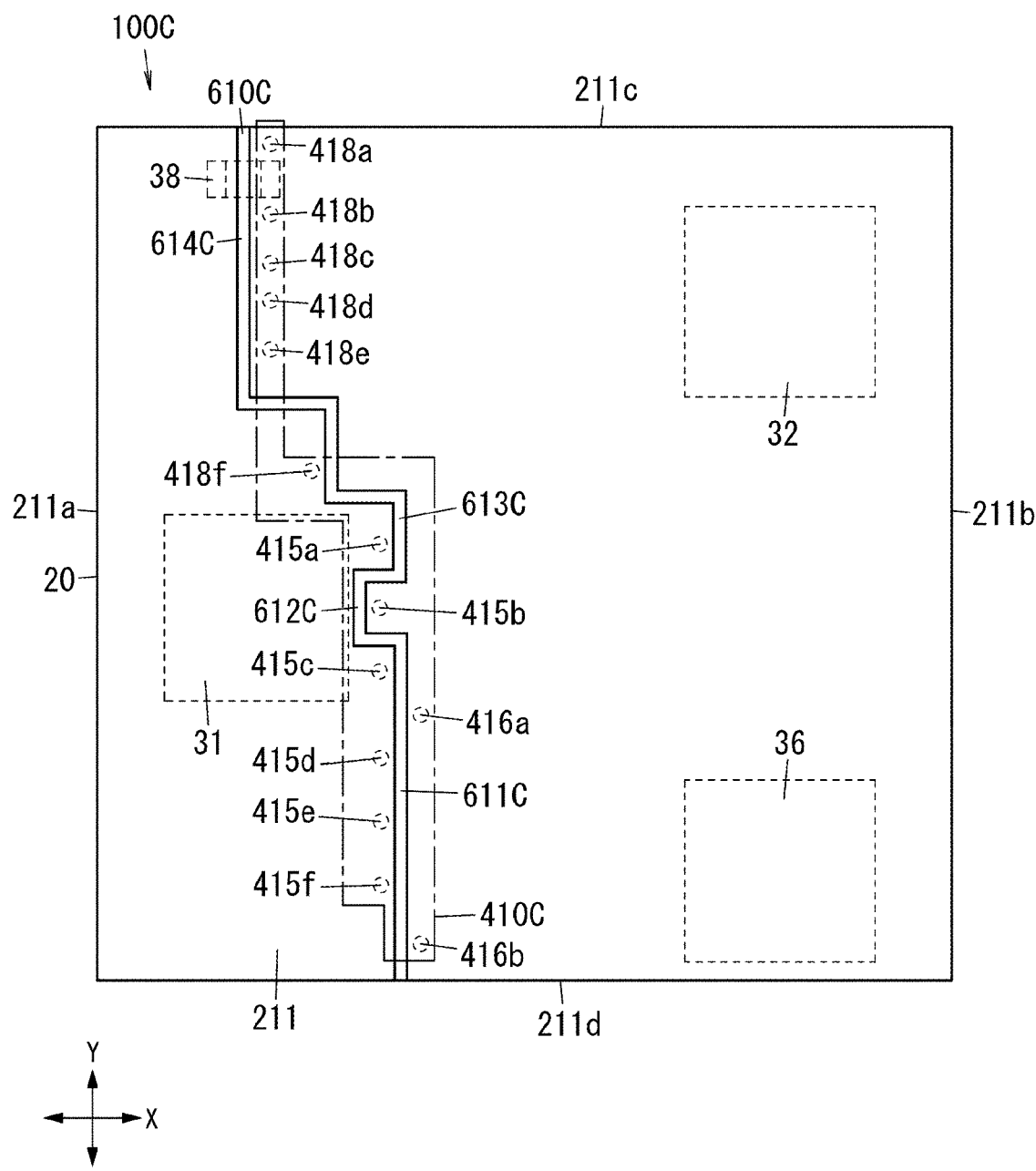
FIG. 7 is a schematic plan view of a circuit module of a third modification example of the above embodiment.

FIG. 7 shows a circuit module 100C according to a third modification example. In the circuit module 100C, the plurality of conductor posts 40 includes a first group 410C, but does not include the second group 420 and the third group 430.

Similar to the first group 410, the first group 410C is a group of the plurality of conductor posts 41 arranged so as to traverse between the power amplifier 31, and the low noise amplifier 32 and the antenna switch circuit 36 on the mounting surface 211. The plurality of conductor posts 41 includes the plurality (six in FIG. 7) of conductor posts 415a, 415b, 415c, 415d, 415e, 415f, the plurality (two in FIG. 7) of conductor posts 416a and 416b. The plurality of conductor posts 41 further includes a plurality (six in FIG. 6) of conductor posts 418a, 418b, 418c, 418d, 418e, 418f. The plurality of conductor posts 418a to 418f is arranged along the second direction Y, between the first end 211c in the second direction Y of the mounting surface 211 and the power amplifier 31. Here, the conductor posts 418a to 418e are arranged in a row. As shown in FIG. 7, the conductor posts 418a and 418b are located on both sides of the capacitor 38 in the second direction Y, respectively. Further, the conductor post 418f is located between the conductor post 418e and the conductor post 415a. In the first group 410C, an interval between the two adjacent conductor posts is set to 1/16 or less of the wave length of the noise generated in the power amplifier 31.

Further, in the circuit module 100C, the shield layer 60 has a slit 610C, but does not have the slit 620 and the slit 630. In other words, the shield layer 60 has the first slit, but does not have the second slit. The slit 610C is formed along the first group 410C. That is, the slit 610C corresponds to the first group 410C. The slit 610C traverses between the power amplifier 31, and the low noise amplifier 32 and the antenna switch circuit 36. More specifically, the slit 610C includes a first portion 611C, a second portion 612C, a third portion 613C, and a fourth portion 614C.

The first portion 611C, from the second end 211d in the second direction Y of the mounting surface 211, passes and extends between a set of the conductor posts 415c to 415f and a set of the conductor posts 416a and 416b. The second portion 612C, from the first portion 611C, passes and extends between the conductor post 415b and the power amplifier 31. The third portion 613C, from the second portion 612C, passes and extends between the conductor post 415a, and the low noise amplifier 32 and the antenna switch circuit 36, and between the conductor post 418f and the low noise amplifier 32. The fourth portion 614C, from the third portion 613C, passes and extends between a set of the conductor posts 418a to 418e and the power amplifier 31.

Thus, the slit 610C has the portions (611C to 613C) that pass between one of the two adjacent conductor posts 41 and the first electronic component (power amplifier 31), and between another of the two adjacent conductor posts 41 and the second electronic component (antenna switch circuit 36). Further, the slit 610C has the portions (613C, 614C) that pass between one of the two adjacent conductor posts 41 and the first electronic component (power amplifier 31), and between another of the two adjacent conductor posts 41 and the second electronic component (low noise amplifier 32). Thus, it is possible to, while maintaining the effect of suppressing the radiation of noise to the outside and the ingress of noise from the outside, reduce the number of conductor posts 40 (41), and reduce the manufacturing cost and the region required for installation of the conductor posts 40 (41).

Further, as shown in FIG. 7, the fourth portion 614C passes over the capacitor 38 provided between the conductor posts 418a, 418B in a plan view. That is, the slit 610C traverses the capacitor 38. The capacitor 38 is an electronic component (a third electronic component) less susceptible to noise (noise generated in the power amplifier 31) than the second electronic components (the low noise amplifier 32, the antenna switch circuit 36) among the plurality of electronic components 30. In other words, it can also be said that the third electronic component is a component which is hard to be magnetically coupled to the first electronic component as compared to the second electronic component. Thus, the slit 610C need not be formed so as not to traverse the third electronic component (capacitor 38). That is, since the slit 610C can be formed using a region on the mounting surface 211 where the third electronic component (capacitor 38) is mounted, a space on the mounting surface 211 can be effectively utilized.

Also in the circuit module 100C described above, similar to the circuit module 100, it is possible to, while suppressing the radiation of noise to the outside and the ingress of noise from the outside, reduce the roundabout of noise through the shield layer 60, thereby improving the isolation characteristics between the electronic components.

2.4 Fourth Modification Example

Figure 8:
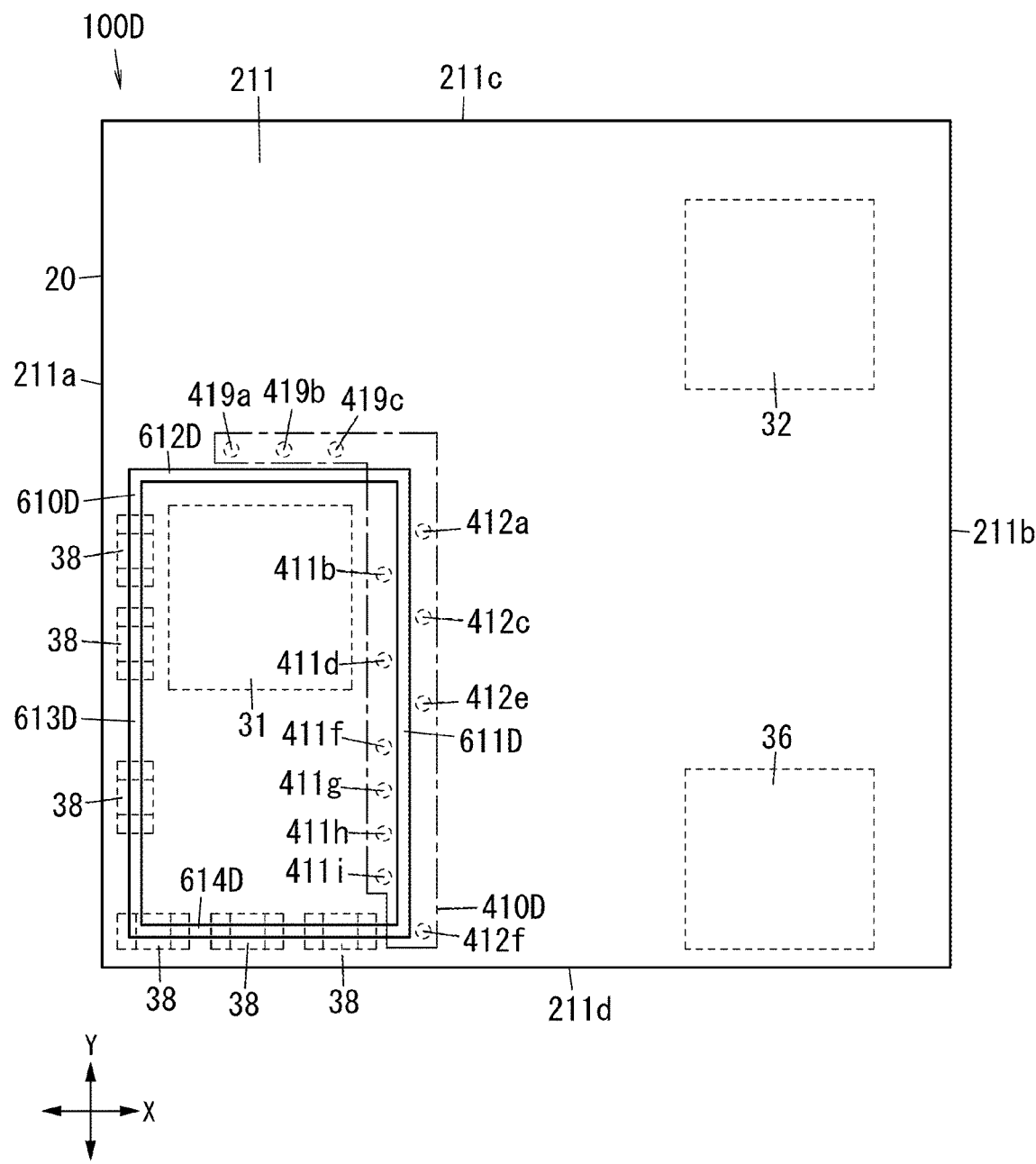
FIG. 8 is a schematic plan view of a circuit module of a fourth modification example of the above embodiment.

FIG. 8 shows a circuit module 100D according to a fourth modification example. In the circuit module 100D, the plurality of conductor posts 40 includes a first group 410D, but does not include the second group 420 and the third group 430.

Similar to the first group 410, the first group 410D is a group of the plurality of conductor posts 41 arranged so as to traverse between the power amplifier 31, and the low noise amplifier 32 and the antenna switch circuit 36 on the mounting surface 211. Similar to the first group 410A, the plurality of conductor posts 41 includes a plurality (six in FIG. 8) of the conductor posts 411b, 411d, 411f to 411i, a plurality (four in FIG. 8) of the conductor posts 412a, 412c, 412e, and 412f. Further, the plurality of conductor posts 41 includes a plurality (three in FIG. 8) of conductor posts 419a, 419b, and 419c. The plurality of conductor posts 419a to 419c is arranged in a row along the first direction X from the first end 211a in the first direction X toward the second end 211b, between the first end 211c in the second direction Y of the mounting surface 211 and the power amplifier 31. In the first group 410D, an interval between the two adjacent conductor posts is set to ¹⁄₁₆ or less of the wave length of the noise generated in the power amplifier 31.

Further, in the circuit module 100D, the shield layer 60 has a slit 610D, but does not have the slit 620 and the slit 630. In other words, the shield layer 60 has the first slit, but does not have the second slit. The slit 610D is formed along the first group 410D. That is, the slit 610D corresponds to the first group 410D. The slit 610D surrounds the power amplifier 31 so as to traverse between the power amplifier 31, and the low noise amplifier 32 and the antenna switch circuit 36. More specifically, the slit 610D includes a first portion 611D, a second portion 612D, a third portion 613D, and a fourth portion 614D.

The first portion 611D is linear and extending along the second direction Y of the mounting surface 211, and passes between a set of the conductor posts 411b, 411d, 411f, 411g, 411h, 411i, and a set of the conductor posts 412a, 412c, 412e, 412f. The second portion 612D is linear and extending, from an end of the first portion 611D on a side of the first end 211c in the second direction Y of the mounting surface 211, along the first direction X of the mounting surface 211, and passes between a set of the conductor posts 419a to 419c and the power amplifier 31. The third portion 613D is linear and extending, from an end of the second portion 612D on a side of the first end 211a in the first direction X of the mounting surface 211, along the second direction Y of the mounting surface 211, and passes between the first end 211a in the first direction X of the mounting surface 211 and the power amplifier 31. The fourth portion 614D is linear and extending from an end of the third portion 613D on a side of the second end 211d in the second direction Y of the mounting surface 211 to an end of the first portion 611D on a side of the second end 211d in the second direction Y of the mounting surface 211, along the second direction Y of the mounting surface 211. The fourth portion 614D passes between the second end 211d in the second direction Y of the mounting surface 211 and the power amplifier 31.

Further, as shown in FIG. 8, the third portion 613D and the fourth portion 614D pass over the capacitors 38 mounted on the mounting surface 211 in a plan view. That is, the slit 610D traverses the capacitor 38 being the third electronic component. Thus, since the slit 610D can be formed using a region of the mounting surface 211 where the third electronic component (capacitor 38) is mounted, a space on the mounting surface 211 can be effectively utilized.

Further, in the shield layer 60, a portion surrounded by the slit 610D (that is, a portion opposed to the power amplifier 31) is separated from another portion. Thus, the noise generated in the power amplifier 31 is suppressed from taking the roundabout route to the low noise amplifier 32 and the antenna switch circuit 36 through the shield layer 60. Note that, in the circuit module 100D, it is preferable that the conductor posts 41 of the first group 410D be arranged so as to surround the power amplifier 31.

Also in the circuit module 100D described above, similar to the circuit module 100, it is possible to, while suppressing the radiation of noise to the outside and the ingress of noise from the outside, reduce the roundabout of noise through the shield layer 60, thereby improving the isolation characteristics between the electronic components.

2.5 Fifth Modification Example

Figure 9:
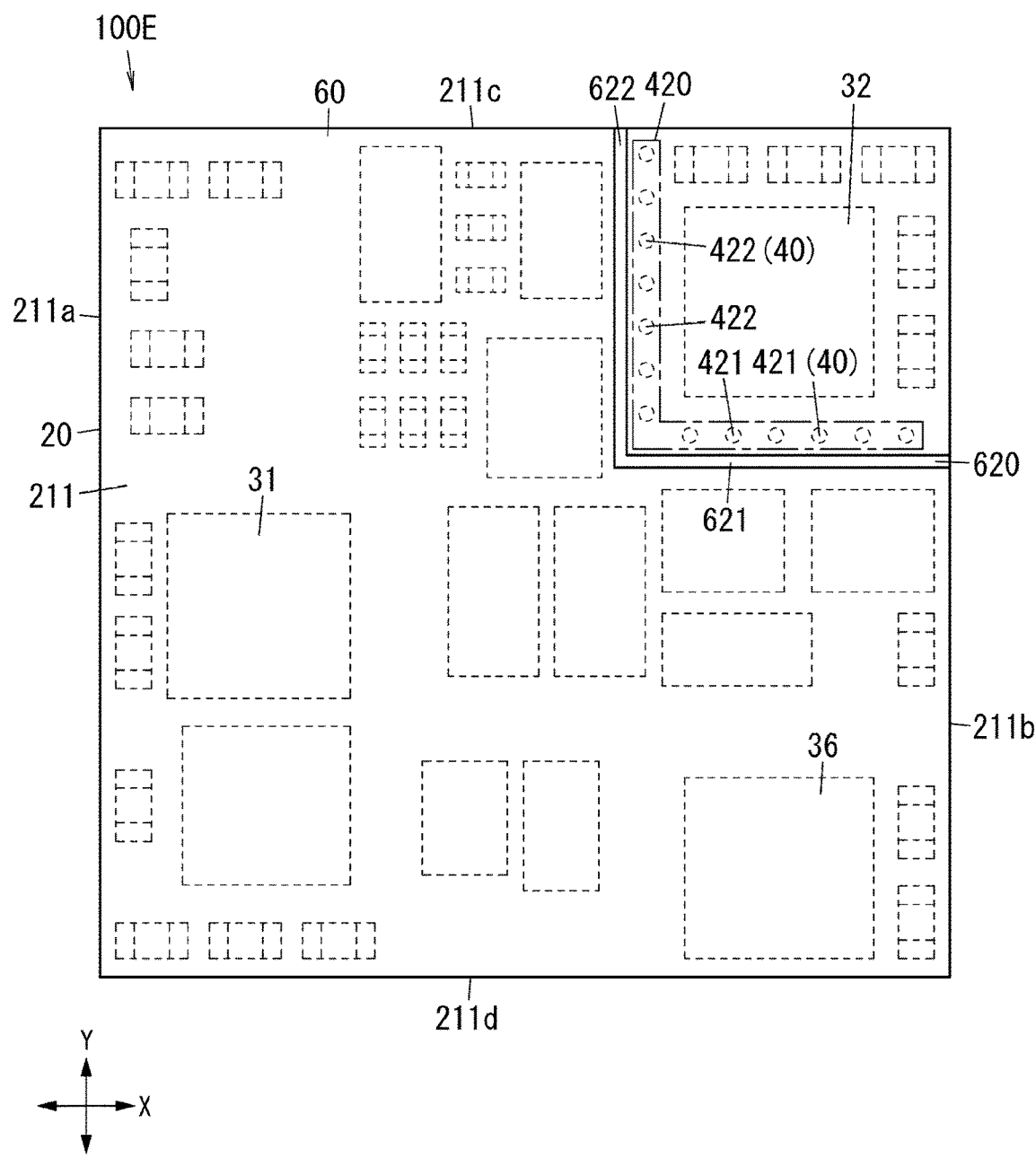
FIG. 9 is a schematic plan view of a circuit module of a fifth modification example of the above embodiment.

FIG. 9 shows a circuit module 100E according to a fifth modification example. In circuit module 100E, the plurality of conductor posts 40 includes the second group 420, but does not include the first group 410 and the third group 430. Further, the shield layer 60 has the slit 620, but does not have the slit 610 and the slit 630. Note that, the first ground layer 22 has the second gap 222, but does not have the first gap 221 and the third gap 223. Also in the circuit module 100E described above, similar to the circuit module 100, it is possible to, while suppressing the radiation of noise to the outside and the ingress of noise from the outside, reduce the roundabout of noise through the shield layer 60, thereby improving the isolation characteristics between the electronic components.

2.6 Sixth Modification Example

Figure 10:
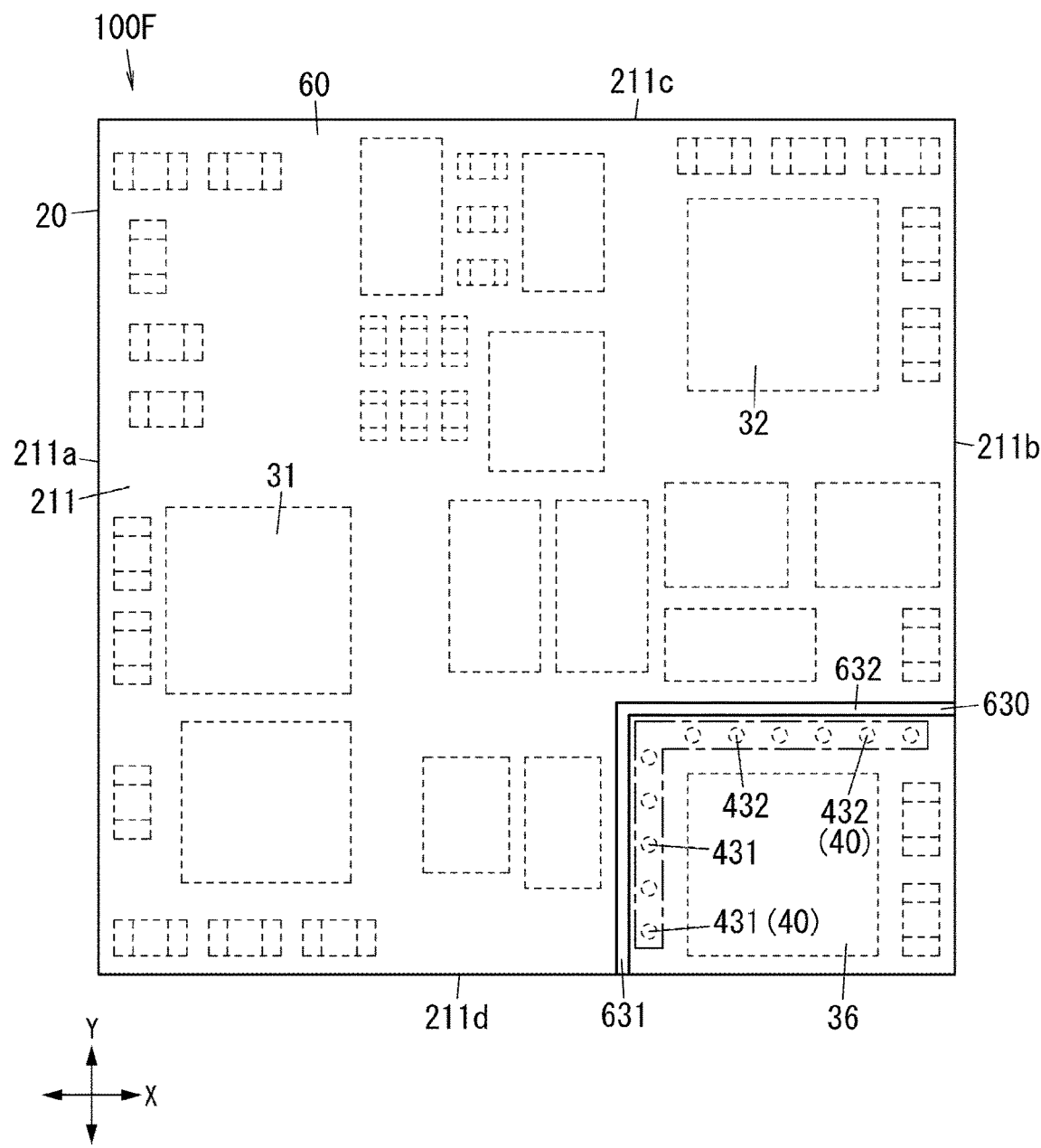
FIG. 10 is a schematic plan view of a circuit module of a sixth modification example of the above embodiment.

FIG. 10 shows a circuit module 100F according to a sixth modification example. In the circuit module 100F, the plurality of conductor posts 40 includes the third group 430, but does not include the first group 410 and the second group 420. Further, the shield layer 60 has the slit 630, but does not have the slit 610 and the slit 620. Note that, the first ground layer 22 has the third gap 223, but does not have the first gap 221 and the second gap 222. Also in the circuit module 100F described above, similar to the circuit module 100, it is possible to, while suppressing the radiation of noise to the outside and the ingress of noise from the outside, reduce the roundabout of noise through the shield layer 60, thereby improving the isolation characteristics between the electronic components.

2.7 Seventh Modification Example

Figure 11:
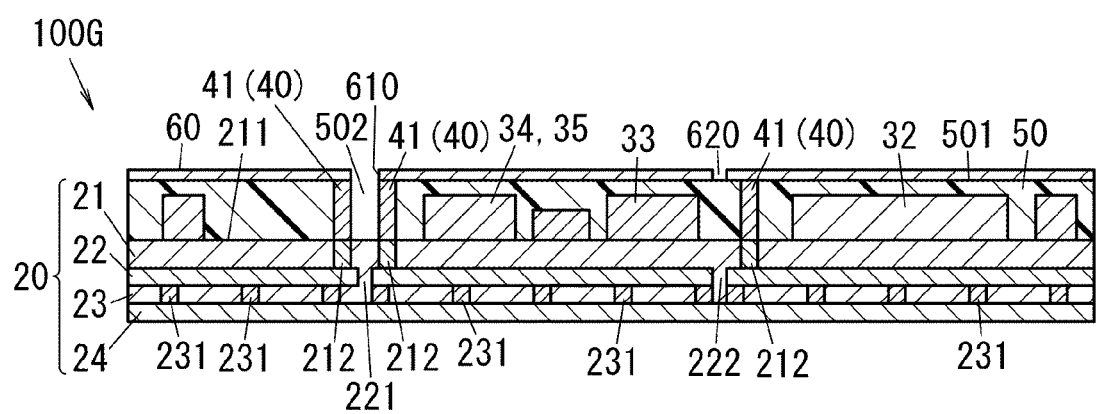
FIG. 11 is a schematic cross-sectional view of a circuit module of a seventh modification example of the above embodiment.

FIG. 11 shows a circuit module 100G according to a seventh modification example. In the circuit module 100G, the mold layer 50 has a gap 502. The gap 502 extends along the slit 610. Thus, similar to the slit 610, the gap 502 traverses, along the group 410 of conductor posts, between the first electronic component (power amplifier 31) and the second electronic components (low noise amplifier 32 and antenna switch circuit 36). In other words, the gap 502 exists in the mold layer 50, between a portion for sealing the power amplifier 31, and a portion for sealing the low noise amplifier 32 and the antenna switch circuit 36. Thus, the isolation characteristics between the first electronic component (the power amplifier 31) and the second electronic components (the low noise amplifier 32 and the antenna switch circuit 36) can be further improved. Note that, in the circuit module 100G, the gap 502 exposes the mounting surface 211, but it is not always necessary to expose the mounting surface 211, and the gap 502 may be a recess that is recessed deeper than the surface 501. Further, the circuit module 100G may have a gap extending along the slit 620, or may have a gap extending along the slit 630.

2.8 Other Modification Examples

The schematic circuit diagram in FIG. 1 is an example of a circuit of a circuit module. For example, in the circuit module, the plurality of electronic components 30 may include a single duplexer instead of including the plurality of duplexers 33. In this case, the first switch circuit 34, the second switch circuit 35, and the antenna switch circuit 36 are not essential. Further, the electronic components 30 may include a plurality of the low noise amplifiers 32 instead of the second switch circuit 35. In short, a circuit configuration of the circuit module may be appropriately changed as necessary.

Further, the circuit board 20 need not have a quadrangular shape (for example, a square shape or a rectangular shape), and may have a desired shape such as a polygonal shape or a circular shape. Further, the circuit board 20 need not have the second electrical insulating layer 23 and the second ground layer 24. Further, the ground layer 22 need not have the gaps (221, 222, 223). Alternatively, the second ground layer 24 may have the gaps (221, 222, 223).

Also, it is sufficient that the plurality of electronic components 30 includes at least the first electronic component such as the power amplifier 31 and the second electronic components such as the low noise amplifier 32 and the antenna switch circuit 36. In addition, the arrangement of the plurality of electronic components 30 on the mounting surface 211 is not particularly limited, and may be appropriately changed as necessary.

Further, it is sufficient that the plurality of conductor posts 40 includes at least one of the first group (410, 410A to 410D), the second group (420, 420A), and the third group (430, 430A). Also, the number of the conductor posts 40 included in the groups 400 of conductor posts is not particularly limited. Note that, each of the conductor posts 40 may have a shape other than a columnar shape (for example, a prismatic shape or a plate-like shape). Further, it is sufficient that a size of the conductor post 40 itself is a size to provide an effect of shielding the noise from the first electronic component.

In addition, even when there is the plurality of groups 400 of conductor posts, it is sufficient that the shield layer 60 has the slits 600 corresponding to at least one of the groups 400 of conductor posts. Further, each of the slits 600 (610, 610A, 610B, 610C, 610D, 620, 620A, 630, 630A) may be formed not by a single slit but by a plurality of circular or polygonal holes.

3. Aspects

As is apparent from the above-described embodiment and modification examples, a circuit module (100; 100A; 100B; 100C; 100D; 100E; 100F; 100G) according to a first aspect includes a circuit board (20), a plurality of electronic components (30), a plurality of conductor posts (40), a mold layer (50), and a shield layer (60). The circuit board (20) has an electrical insulating layer (21) having a mounting surface (211) and a ground layer (22) provided on a side of the electrical insulating layer (21) opposite to the mounting surface (211). The plurality of electronic components (30) includes a first electronic component (31) mounted on the mounting surface (211) and acting as a source of noise, and second electronic components (32, 36) to be protected from noise generated in the first electronic component. The plurality of conductor posts (40) includes a group of conductor posts (400) arranged so as to traverse between the first electronic component (31) and the second electronic components (32, 36) on the mounting surface (211) and electrically connected to the ground layer (22). The mold layer (50) is electrically insulating and is formed on the mounting surface (211) so as to seal the plurality of electronic components (30) and the plurality of conductor posts (40). The shield layer (60) covers a surface (501) on a side of the mold layer (50) opposite to the mounting surface. The shield layer (60) has a slit (600). The slit (600), with respect to each conductor post (40) included in the group (400) of the conductor posts, in a plan view, passes and extends between the conductor post (40) and the first electronic component (31), or between the conductor post (40) and the second electronic components (32, 36). According to the first aspect, it is possible to, while suppressing radiation of noise to an outside and ingress of noise from the outside, reduce a roundabout of noise through the shield layer (60), thereby improving isolation characteristics between the electronic components (first and second electronic components).

A circuit module (100B; 100C) of a second aspect may be implemented in combination with the first aspect. In the second aspect, the slit (610B; 610C) includes a portion passing between one of the two adjacent conductor posts (40) included in the group (400) of the conductor posts and the first electronic component (31) and between another of the two adjacent conductor posts (40) and the second electronic components (32, 36). According to the second aspect, it is possible to, while maintaining an effect of suppressing the radiation of noise to the outside and the ingress of noise from the outside, reduce the number of conductor posts (40), and reduce a manufacturing cost and a region required for installation of the conductor posts (40).

A circuit module (100C; 100D) of a third aspect may be implemented in combination with the first aspect or the second aspect. In the third aspect, the plurality of electronic components (30) includes a third electronic component (38) less susceptible to the noise compared to the second electronic components (32, 36). The slit (610C; 610D) traverses the third electronic component (38). According to the third aspect, a space on the mounting surface (211) can be effectively utilized.

A circuit module (100; 100A; 100B; 100C; 100D; 100E; 100F; 100G) of a fourth aspect may be implemented in combination with any of the first to third aspects. In the fourth aspect, the ground layer (22) has gaps (221, 222, 223) passing through the ground layer (22) in a thickness direction. The gaps (221, 222, 223) extend along the slits (610, 620, 630). According to the fourth aspect, a roundabout of noise through the ground layer (22) can be reduced.

A circuit module (100; 100A; 100B; 100C; 100D; 100E; 100F; 100G) of a fifth aspect may be implemented in combination with any of the first to fourth aspects. In the fifth aspect, the mold layer (50) is formed such that tip ends of the plurality of conductor posts (40) are exposed to the surface (501). The shield layer (60) is formed on the surface (501) so as to contact the tip ends of the plurality of conductor posts (40). According to the fifth aspect, since the shield layer (60) is electrically connected to the ground layer (22) by the plurality of conductor posts (40), there is no need to provide a new grounding wiring for the shield layer (60).

A circuit module (100; 100A; 100B; 100C; 100D; 100E; 100F; 100G) of a sixth aspect may be implemented in combination with any of the first to fifth aspects. In the sixth aspect, the intervals between the conductor posts (40) in the group (400) of the conductor posts are $1/16$ or less of a wave length of the noise. According to the sixth aspect, it is possible to, while maintaining the effect of suppressing the radiation of noise to the outside and the ingress of noise from the outside, reduce the number of conductor posts (40), and reduce the manufacturing cost and the region required for installation of the conductor posts (40).

A circuit module (100; 100A) of a seventh aspect may be implemented in combination with any of the first to sixth aspects. In the seventh aspect, the group (400) of conductor posts is a group (410; 410A) of first conductor posts. The plurality of conductor posts (40) includes a group (420, 430) of second conductor posts disposed between the group (410; 410A) of the first conductor posts and the second electronic components (32, 36) on the mounting surface (211) and electrically connected to the ground layer (22). According to the seventh aspect, compared to a case where the plurality of conductor posts (40) includes only the group (410; 410A) of the first conductor posts, further improvement in isolation characteristics between the first electronic component and the second electronic component can be achieved.

A circuit module (100) of an eighth aspect may be implemented in combination with the seventh aspect. In the eighth aspect, the slit (600) is a first slit (610). The shield layer (60) has second slits (620, 630). The second slits (620, 630), with respect to respective second conductor posts (42, 43) included in the groups (420, 430) of second conductor posts, in a plan view, pass between second conductor posts (42, 43) and the group (410) of first conductor posts, or between the second conductor posts (42, 43) and the second electronic components (32, 36). According to the eighth aspect, compared to a case where the shield layer (60) includes only the first slit (610), it is possible to further suppress the roundabout of the noise through the shield layer (60).

A circuit module (100; 100A; 100B; 100C; 100D; 100E; 100F; 100G) of a ninth aspect may be implemented in combination with any of the first to eighth aspects. In the ninth aspect, the first electronic component (31) is a power amplifier (31), and the second electronic component (32, 36) is a low noise amplifier (32) or an antenna switch circuit (36). According to the ninth aspect, it is possible to reduce influence from noise generated in the power amplifier (31) on the low noise amplifier (32) or the antenna switch circuit (36).

100, 100A TO 100G CIRCUIT MODULES
20 CIRCUIT BOARD
21 ELECTRICAL INSULATING LAYER (FIRST ELECTRICAL INSULATING LAYER)
22 GROUND LAYER (FIRST GROUND LAYER)
211 MOUNTING SURFACE
30 ELECTRONIC COMPONENT
31 POWER AMPLIFIER (FIRST ELECTRONIC COMPONENT)
32 LOW NOISE AMPLIFIER (SECOND ELECTRONIC COMPONENT)
36 ANTENNA SWITCH CIRCUIT (SECOND ELECTRONIC COMPONENT)
38 CAPACITOR (THIRD ELECTRONIC COMPONENT)
40 CONDUCTOR POST
41 CONDUCTOR POST (FIRST CONDUCTOR POST)
42 CONDUCTOR POST (SECOND CONDUCTOR POST)
43 CONDUCTOR POST (SECOND CONDUCTOR POST)
400 GROUP OF CONDUCTOR POSTS
410, 410A TO 410D FIRST GROUPS (GROUPS OF CONDUCTOR POSTS)
420, 420A SECOND GROUPS (GROUPS OF CONDUCTOR POSTS)
430, 430A THIRD GROUPS (GROUPS OF CONDUCTOR POSTS)
50 MOLD LAYER
501 SURFACE
60 SHIELD LAYER
600 SLIT
610, 610A TO 610D SLITS (FIRST SLITS)
620, 620A SLITS (SECOND SLITS)
630, 630A SLITS (SECOND SLITS)

The invention claimed is:

1. A circuit module, comprising:
a circuit board having an electrical insulating layer and a ground layer, wherein the electrical insulating layer has a mounting surface, and the ground layer is provided on a side of the electrical insulating layer opposite to the mounting surface;
a plurality of electronic components mounted on the mounting surface and including a first electronic component and a second electronic component, wherein the first electronic component acts as a source of noise and the second electronic component is an object to be protected from the noise generated in the first electronic component;
a plurality of conductor posts including a group of conductor posts arranged so as to traverse between the first electronic component and the second electronic component on the mounting surface and electrically connected to the ground layer;
a mold layer having electrical insulation and provided on the mounting surface so as to seal the plurality of electronic components and the plurality of conductor posts; and
a shield layer covering a surface on a side of the mold layer opposite to the mounting surface,
wherein the shield layer includes a slit, and with respect to each conductor post included in the group of the conductor posts, in a plan view, the silt passes and extends between the conductor posts and the first electronic component, or between the conductor posts and the second electronic component.

2. The circuit module according to claim 1,
wherein the slit has a portion passing between one of two adjacent conductor posts included in the group of the conductor posts and the first electronic component and between another of the two adjacent conductor posts and the second electronic component.

3. The circuit module according to claim 1,
wherein the plurality of electronic components includes a third electronic component less susceptible to the noise than the second electronic component, and
the slit traverses the third electronic component.

4. The circuit module according to claim 1,
wherein the ground layer has a gap passing through the ground layer in a thickness direction, and
the gap extends along the slit.

5. The circuit module according to claim 1,
wherein the mold layer is provided so that tip ends of the plurality of conductor posts are exposed to the surface, and
the shield layer is provided on the surface so as to contact the tip ends of the plurality of conductor posts.

6. The circuit module according to claim 1,
wherein intervals between conductor posts in the group of the conductor posts are $\frac{1}{16}$ or less of a wave length of the noise.

7. The circuit module according to claim 1,
wherein the group of the conductor posts is a group of first conductor posts, and
the plurality of conductor posts includes a group of second conductor posts disposed between the group of the first conductor posts and the second electronic component on the mounting surface and electrically connected to the ground layer.

8. The circuit module according to claim 7,
wherein the slit is a first slit, and
the shield layer has a second slit, and with respect to each second conductor post included in the group of the second conductor posts, in a plan view, the second slit passes between the second conductor post and the group of the first conductor posts, or between the second conductor post and the second electronic component.

9. The circuit module according to claim 1,
wherein the first electronic component is a power amplifier, and
the second electronic component is a low noise amplifier or an antenna switch circuit.

10. The circuit module according to claim 2,
wherein the plurality of electronic components includes a third electronic component less susceptible to the noise than the second electronic component, and
the slit traverses the third electronic component.

11. The circuit module according to claim 2,
wherein the ground layer has a gap passing through the ground layer in a thickness direction, and
the gap extends along the slit.

12. The circuit module according to claim 3,
wherein the ground layer has a gap passing through the ground layer in a thickness direction, and
the gap extends along the slit.

13. The circuit module according to claim 2,
wherein the mold layer is provided so that tip ends of the plurality of conductor posts are exposed to the surface, and
the shield layer is provided on the surface so as to contact the tip ends of the plurality of conductor posts.

14. The circuit module according to claim 3,
wherein the mold layer is provided so that tip ends of the plurality of conductor posts are exposed to the surface, and
the shield layer is provided on the surface so as to contact the tip ends of the plurality of conductor posts.

15. The circuit module according to claim 4,
wherein the mold layer is provided so that tip ends of the plurality of conductor posts are exposed to the surface, and
the shield layer is provided on the surface so as to contact the tip ends of the plurality of conductor posts.

16. The circuit module according to claim 2,
wherein intervals between conductor posts in the group of the conductor posts are $1/16$ or less of a wave length of the noise.

17. The circuit module according to claim 3,
wherein intervals between conductor posts in the group of the conductor posts are $1/16$ or less of a wave length of the noise.

18. The circuit module according to claim 4,
wherein intervals between conductor posts in the group of the conductor posts are $1/16$ or less of a wave length of the noise.

19. The circuit module according to claim 5,
wherein intervals between conductor posts in the group of the conductor posts are $1/16$ or less of a wave length of the noise.

20. The circuit module according to claim 2,
wherein the group of the conductor posts is a group of first conductor posts, and
the plurality of conductor posts includes a group of second conductor posts disposed between the group of the first conductor posts and the second electronic component on the mounting surface and electrically connected to the ground layer.

* * * * *